US008563221B2

(12) United States Patent
Qiu et al.

(10) Patent No.: US 8,563,221 B2
(45) Date of Patent: Oct. 22, 2013

(54) PHOTOTOOLS HAVING A PROTECTIVE LAYER

(75) Inventors: Zai-Ming Qiu, Woodbury, MN (US); John C. Hulteen, Afton, MN (US); Douglas C. Fall, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 410 days.

(21) Appl. No.: 12/922,129

(22) PCT Filed: Mar. 11, 2009

(86) PCT No.: PCT/US2009/036725
§ 371 (c)(1),
(2), (4) Date: Sep. 10, 2010

(87) PCT Pub. No.: WO2009/114572
PCT Pub. Date: Sep. 17, 2009

(65) Prior Publication Data
US 2011/0008733 A1    Jan. 13, 2011

Related U.S. Application Data

(60) Provisional application No. 61/035,578, filed on Mar. 11, 2008.

(51) Int. Cl.
*G03F 7/016* (2006.01)
*G03C 5/26* (2006.01)

(52) U.S. Cl.
USPC ............ 430/272.1; 430/5; 430/311; 430/537; 522/77; 522/99; 522/129

(58) Field of Classification Search
None
See application file for complete search history.

(56) References Cited

U.S. PATENT DOCUMENTS

| | | | |
|---|---|---|---|
| 3,131,161 A | 4/1964 | Nitzsche |
| 3,250,808 A | 5/1966 | Moore, Jr. |
| 3,753,755 A | 8/1973 | Olson |
| 3,875,045 A | 4/1975 | Bergrahm |
| 4,000,115 A | 12/1976 | Jacobs |
| 4,025,348 A | 5/1977 | Tsukada |
| 4,025,407 A | 5/1977 | Chang |
| 4,049,861 A | 9/1977 | Nozari |
| 4,058,401 A | 11/1977 | Crivello |
| 4,069,055 A | 1/1978 | Crivello |
| 4,094,911 A | 6/1978 | Mitsch |
| 4,100,134 A | 7/1978 | Robins |
| 4,101,513 A | 7/1978 | Fox |
| 4,130,690 A | 12/1978 | Lien |
| 4,156,035 A | 5/1979 | Tsao |
| 4,156,046 A | 5/1979 | Lien |
| 4,161,478 A | 7/1979 | Crivello |
| 4,267,302 A | 5/1981 | Ohmori |
| 4,279,717 A | 7/1981 | Eckberg |
| 4,293,606 A | 10/1981 | Zollinger |
| 4,333,998 A | 6/1982 | Leszyk |
| 4,337,107 A | 6/1982 | Eshleman |
| 4,348,462 A | 9/1982 | Chung |
| 4,353,980 A | 10/1982 | Helling |
| 4,399,192 A | 8/1983 | Russell |
| 4,426,431 A | 1/1984 | Harasta |
| 4,504,401 A | 3/1985 | Matsuo |
| 4,508,916 A | 4/1985 | Newell |
| 4,623,676 A | 11/1986 | Kistner |
| 4,647,413 A | 3/1987 | Savu |
| 4,818,801 A | 4/1989 | Rice |
| 4,830,910 A | 5/1989 | Larson |
| 4,959,426 A | 9/1990 | Re |
| 5,021,501 A | 6/1991 | Ohmori |
| 5,073,404 A | 12/1991 | Huang |
| 5,274,159 A | 12/1993 | Pellerite |
| 5,340,898 A | 8/1994 | Cavezzan |
| 5,514,728 A | 5/1996 | Lamanna |
| 5,554,664 A | 9/1996 | Lamanna |
| 5,576,095 A | 11/1996 | Ueda |
| 5,723,860 A | 3/1998 | Hamada |
| 5,980,992 A | 11/1999 | Kistner |
| 6,187,834 B1 | 2/2001 | Thayer |
| 6,190,743 B1 | 2/2001 | Wang |
| 6,204,350 B1 | 3/2001 | Liu |
| 6,344,526 B1 | 2/2002 | Noguchi |
| 6,361,870 B1 | 3/2002 | Steffl |
| 6,448,346 B1 | 9/2002 | Noguchi |
| 6,646,088 B2 | 11/2003 | Fan |
| 6,678,495 B1 | 1/2004 | Badesha |
| 6,753,380 B2 | 6/2004 | Qiu |

(Continued)

FOREIGN PATENT DOCUMENTS

DE    10004132    8/2001
EP       212319    3/1987

(Continued)

OTHER PUBLICATIONS

Bongiovanni, "Use of Fluorinated Compounds in Cationic UV-curing," Photochemistry and UV Curing: New Trends, 2006, pp. 279-292.
Coggio, "New Durable, Soil Resistant Optical Film for Front Surface Protection of Flat-Panel Displays", Digest of Technical Papers, Society for Information Display International Symposium, 2005, vol. 36, pp. 175-177.
"Epoxide", source unknown, date unknown but believed to be prior to the date of the filing of the present application, 4 pages.
"Epoxy Resins", source unknown, date unknown but believed to be prior to the date of the filing of the present application, 4 pages.

(Continued)

*Primary Examiner* — Cynthia Hamilton
(74) *Attorney, Agent, or Firm* — Robert W. Sprague

(57)  ABSTRACT

A phototool comprises an optically transparent substrate having designed pattern and a protective layer on the substrate. The protective layer comprises a cured hardcoat composition. The hardcoat composition comprises (i) one or more epoxy silane compounds (ii) one or more fluorochemical additives selected from the group consisting of perfluoropolyether-urethane silanes and silane-functionalized perfluoropolyether acrylate oligomers, and (iii) photo-acid generator.

27 Claims, No Drawings

(56) References Cited

U.S. PATENT DOCUMENTS

| | | |
|---|---|---|
| 6,767,946 B2 | 7/2004 | Shimada |
| 6,803,109 B2 | 10/2004 | Qiu |
| 6,811,931 B1 | 11/2004 | Fujioka |
| 7,037,585 B2 | 5/2006 | Treadway |
| 7,097,910 B2 | 8/2006 | Moore |
| 7,166,329 B2 | 1/2007 | Dams |
| 7,189,479 B2 | 3/2007 | Lu |
| 7,335,786 B1 | 2/2008 | Iyer |
| 7,495,118 B2 | 2/2009 | Dams |
| 7,718,264 B2 | 5/2010 | Klun |
| 7,728,098 B2 | 6/2010 | Dams |
| 7,745,653 B2 | 6/2010 | Iyer |
| 7,825,272 B2 | 11/2010 | Iyer |
| 7,897,678 B2 | 3/2011 | Qiu |
| 8,002,886 B2 | 8/2011 | Clark |
| 8,015,970 B2 | 9/2011 | Klun |
| 2003/0207963 A1 | 11/2003 | Zang |
| 2004/0014718 A1 | 1/2004 | Pai |
| 2004/0077775 A1 | 4/2004 | Audenaert |
| 2004/0092675 A1 | 5/2004 | Moore |
| 2004/0147188 A1 | 7/2004 | Johnson |
| 2005/0037932 A1 | 2/2005 | Liu |
| 2005/0042553 A1 | 2/2005 | Lu |
| 2005/0054804 A1 | 3/2005 | Dams |
| 2005/0121644 A1 | 6/2005 | Dams |
| 2005/0164010 A1 | 7/2005 | Trombetta |
| 2005/0196626 A1 | 9/2005 | Knox |
| 2005/0196696 A1 | 9/2005 | King |
| 2005/0233103 A1 | 10/2005 | Enomoto |
| 2006/0147177 A1 | 7/2006 | Jing |
| 2006/0148350 A1 | 7/2006 | Chang |
| 2006/0153993 A1 | 7/2006 | Schmidt |
| 2006/0154091 A1 | 7/2006 | Schmidt |
| 2006/0165919 A1 | 7/2006 | Suzuki |
| 2006/0216524 A1 | 9/2006 | Klun |
| 2006/0228560 A1 | 10/2006 | Stewart |
| 2007/0014927 A1 | 1/2007 | Buckanin |
| 2007/0128557 A1 | 6/2007 | Lu |
| 2007/0275171 A1 | 11/2007 | Dang |
| 2007/0287093 A1 | 12/2007 | Jing |
| 2008/0041272 A1 | 2/2008 | Tomasino |
| 2008/0075947 A1 | 3/2008 | Padiyath |
| 2008/0124555 A1 | 5/2008 | Klun |
| 2009/0025608 A1 | 1/2009 | Qiu |
| 2009/0025727 A1 | 1/2009 | Klun |
| 2009/0148711 A1 | 6/2009 | LeBlanc |
| 2010/0092686 A1 | 4/2010 | Laryea |
| 2010/0160595 A1 | 6/2010 | Klun |
| 2011/0020657 A1 | 1/2011 | Chang |
| 2011/0027702 A1 | 2/2011 | Qiu |
| 2011/0065045 A1 | 3/2011 | Qiu |

FOREIGN PATENT DOCUMENTS

| | | |
|---|---|---|
| EP | 271872 | 6/1988 |
| EP | 572179 | 12/1993 |
| EP | 1083205 | 3/2001 |
| EP | 1225187 | 7/2002 |
| EP | 1225188 | 7/2002 |
| EP | 1411073 | 4/2004 |
| FR | 2886309 | 12/2006 |
| JP | 2232251 | 9/1990 |
| JP | 10176139 | 6/1998 |
| JP | 2004250517 | 9/2004 |
| JP | 2005046767 | 2/2005 |
| JP | 2006169328 | 6/2006 |
| KR | 10-2006-0080182 | 7/2006 |
| WO | WO 03/055954 | 7/2003 |
| WO | WO 03/072625 | 9/2003 |
| WO | WO 2004/024790 | 3/2004 |
| WO | WO 2004/056495 | 7/2004 |
| WO | WO 2005/014742 | 2/2005 |
| WO | WO 2005/023822 | 3/2005 |
| WO | WO 2006/030721 | 3/2006 |
| WO | WO 2006/074033 | 7/2006 |
| WO | WO 2008/131715 | 11/2008 |
| WO | WO 2009/035874 | 3/2009 |
| WO | WO 2009/069974 | 6/2009 |
| WO | WO 2009/083564 | 7/2009 |
| WO | WO 2009/086515 | 7/2009 |
| WO | WO 2009/114572 | 9/2009 |
| WO | WO 2009/114580 | 9/2009 |
| WO | WO 2011/011167 | 1/2011 |
| WO | WO 2011/034845 | 3/2011 |
| WO | WO 2011/034847 | 3/2011 |
| WO | WO 2011/034885 | 3/2011 |

OTHER PUBLICATIONS

"Mask Process", PKL, Choognam, Korea, [online], [retrieved from the internet on Feb. 25, 2008], www.pkl.co.kr/english/product/product05.html, 3 pages.

Physical Review E, Statistical Physics, Plasmas, Fluids, and Related Interdisciplinary Topics, vol. 59, No. 2, Part A, 5 pages, Feb. 1999.

Sangermano, "Fluorinated Alcohols as Surface-Active Agents in Cationic Photopolymerization of Epoxy Monomers", Journal of Polymer Science: Part A: Polymer Chemistry, 2006, vol. 43, pp. 4144-4150.

Sangermano, "Fluorinated Hyperbranched Polymers as Additives in Cationic Photopolymerization" Macromolecular Materials and Engineering, 2004, vol. 289, No. 8, pp. 722-727.

Sangermano, "Synthesis and Cationic Photopolymerization of a New Fluorinated Oxetane Monomer", Polymer, 2004, vol. 45, No. 7, pp. 2133-2139.

Sangermano, "Synthesis and Cationic Photopolymerization of New Fluorinated Polyfunctional Propenyl Ether Oligomers", Journal of Polymer Science, Part A: Polymer Chemistry, 2006, vol. 44, pp. 6943-6951.

Yarbrough, "Contact Angle Analysis, Surface Dynamics, and Biofouling Characteristics of Cross-Linkable, Random Perfluoropolyether-Based Graft Terpolymers", Macromolecules, 2006, vol. 39, pp. 2521-2528.

Intl Search Report for PCT/US2009/036725, 3 pages.
Intl Search Report for PCT/US2009/036733, 3 pages.

PHOTOTOOLS HAVING A PROTECTIVE LAYER

CROSS REFERENCE TO RELATED APPLICATIONS

This application is a national stage filing under 35 U.S.C. 371 of PCT/US2009/036725, filed Mar. 11, 2009, which claims priority to Provisional Application No. 61/035,578, filed Mar. 11, 2008, the disclosure of which is incorporated by reference in its/their entirety herein.

FIELD

This invention relates to phototools having a protective layer and to methods of making a printed circuit using the phototools of the invention.

BACKGROUND

In the printed circuit industry, photographic masks or stencils bearing a circuit pattern are known as phototools. Such a stencil, through which a photoresist can be exposed, provides an intricate complex image representing an electrical circuit. The image often consists of many fine lines and junctions spaced closely together. During its use to make printed circuit boards, the phototool is placed face down on a photoresist layer and a contact print is made by exposing the photoresist to high intensity light through the phototool. In this way, a single phototool can be used to make multiple contact prints.

After processing, a phototool must be carefully inspected through a microscope to ensure that there are no breaks in the fine lines of the image. The continued use of the phototool can cause tiny scratches and abrasions on the phototool surface. The photoresists on which the phototool is placed are usually laminated on sheet copper and small burrs or rough edges of the copper sheet can cause scratches as the phototool is transferred from one photoresist to the next. The phototool is also frequently wiped with a soft cloth to make sure it is dust and lint free. Small particles of dirt can cause scratching as they are wiped across the phototool surface. Because of this general wear and tear on the phototool surfaced during normal use, the phototool must be frequently inspected to ensure line continuity. Depending upon the size and the intricacy of the phototool, such microscopic inspections can take 2 to 3 hours.

Due to the fact that phototools are vulnerable to scratching and that abrasion is a serious problem during the normal use of a phototool, protective films and overcoats are often employed to protect the phototool. For example, polyester films coated with various kinds of pressure sensitive adhesives have been laminated to image-bearing surfaces to protect the image. Because of their thickness, however, laminating films can cause optical distortion and hence loss of resolution. Thinner protective coatings can be obtained by coating the surfaces of phototools with liquid compositions. After application, the thin liquid coating is hardened to yield the desired protective coat. Epoxy silanes and acrylate esters (for example, polyurethane acrylates) are useful in such coatings because of their resistance to abrasion. Many protective overcoats have limited release properties, however, and can therefore stick to the surface of the photoresist, particularly when relatively sticky materials such as high viscosity solder mask inks are present.

SUMMARY

In view of the foregoing, we recognize that there is a need for phototools that are protected from scratching and abrasion, yet release easily from relatively sticky materials such as solder mask inks.

Briefly, in one aspect, the present invention provides a phototool comprising an optically clear substrate having a designed pattern and a low surface energy protective layer on the substrate. The protective layer comprises a cured hardcoat composition, wherein the hardcoat composition comprises (i) one or more epoxy silane compounds, (ii) one or more fluorochemical additives selected from the group consisting of perfluoropolyether-urethane silanes and silane-functionalized perfluoropolyether acrylate oligomers, and (iii) photo-acid generator.

As used herein, the term "perfluoropolyether-urethane silane" means a compound comprising at least one perfluoropolyether group, at least one curable silane group, and at least one urethane linkage (—OC(O)NH—); and the term "silane-functionalized perfluoropolyether acrylate oligomer" means an acrylate oligomer or polymer comprising at least one pendant perfluoropolyether group and at least one curable silane group.

The protective layer protects the phototools of the invention from scratching and abrasion during normal use of the phototool. In addition, the protective layer has good release properties and therefore does not stick to photoresist surfaces even when sticky materials such as high viscosity solder masks are present. The phototools of the invention can be used to make multiple contact prints (for example, 5 or more (preferably, 10 or more, or 20 or more)).

In another aspect, the present invention provides a method of making a printed circuit comprising placing a phototool of the invention on a photoresist layer, exposing the photoresist layer and phototool to high intensity light, and removing the phototool from the photoresist layer.

In yet another aspect, the present invention provides a hardcoat composition comprising (a) one or more epoxy silane compounds, (b) one or more fluorochemical additives selected from the group consisting of perfluoropolyether-urethane silanes and silane-functionalized perfluoropolyether acrylate oligomers, (c) one or more curable silane compounds, and (d) photo-acid generator.

DETAILED DESCRIPTION

Phototools

Phototools are typically made using a computer-aided design (CAD) system to prepare data for an exposure apparatus (for example, a photo-plotter) based on a target blueprint or data. Then, this data is used to perform direct writing of a designed pattern (for example, a circuit pattern) onto an emulsion photographic dry plate, which has been prepared, for example, by forming a film surface of a photosensitive emulsion layer on an optically clear substrate (for example, a glass, fused silica, polyethylene terephthalate (PET), polycarbonate, or poly(methyl)methacrylate substrate). Optically clear substrates typically have low haze (for example, less than about 5% or even less than about 2%) and are substantially transparent (that is, they typically allow the passage of 95% or more (preferably 98% or more) of visible and ultraviolet light. The photographic dry plate with the pattern thereon is then developed, fixed, washed in water, and dried. It may then be examined for defects and, if necessary, retouched.

The photosensitive emulsion layer typically comprises a silver halide emulsion or a diazo emulsion. Thus, the film surface is relatively soft and easily scratched or marked. Chrome metal absorbing film may also be used.

Protective Layer

The phototools of the present invention have a protective layer on the substrate that provides abrasion resistance. The protective layer comprises a cured hardcoat composition. The hardcoat composition comprises one or more epoxy silane compounds, one or more fluorochemical additives, and photo-acid generator.

Epoxy Silanes

The hardcoat compositions of the invention comprise curable epoxy silane compounds. Curable epoxy silanes are compounds or materials having at least one polymerizable epoxy group and at least one polymerizable silane group, the bridging of these groups being through a non-hydrolyzable aliphatic, aromatic, or aliphatic and aromatic divalent hydrocarbon linkage which may have N, O, and/or S atoms in the linkage chain. The O atoms for example would be within the chain only as ether or ester linkages. These linkage chains may be generally substituted as is well known in the art, as these substituents on the chain do not greatly affect the functional ability of the epoxy-terminated silanes to under the essential reactions necessary to polymerization through the siloxane or epoxy terminal groups. Examples of substituents which may be present on the linkage or bridging moieties are groups such as $NO_2$, $CH_3(CH_2)_nCH_2$, methoxy, ester, amide, urethane, ether and thioether, sulfone, halogen, and the like. In general structural formulae appearing within this description of the invention, such substitution of the bridging moieties is implied unless specifically excluded by language such as "unsubstituted divalent hydrocarbon radical".

The epoxy silane compounds may be monomeric, oligomeric, or polymeric. They may be, for example, acrylates, urethanes, ester-based, or the like.

The epoxy silane compounds can be of the general formula:

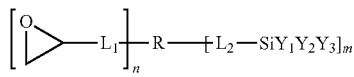

wherein:
$L_1$ is a divalent linkage;
$L_2$ is a divalent linkage;
R is multi-valent (m+n) residue;
$Y_1$, $Y_2$ and $Y_3$ are each independently an alkyl group, aryl group or a hydrolysable group, wherein at least one of $Y_1$, $Y_2$ and $Y_3$ is a hydrolysable group; and
n is at least 1 and m is at least 1.

Preferably the curable epoxy silane compounds are epoxy-terminated silane compounds having terminal polymerizable epoxy groups and terminal polymerizable silane groups, the bridging of these groups being as described above.

Useful epoxy-terminated silane compounds include epoxy-terminated alkoxy silanes of the following structure:

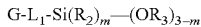

wherein:
$L_1$ is a $C_1$-$C_{14}$ alkylene group,
$R_2$ and $R_3$ independently are $C_1$-$C_4$ alkyl groups,
G is a glycidoxy or epoxycyclohexyl group, and
m is 0 or 1.

Many epoxy-functional alkoxysilanes are suitable, including glycidoxymethyl-trimethoxysilane, glycidoxymethyltriethoxysilane, glycidoxymethyl-tripropoxysilane, glycidoxymethyl-tributoxysilane, β-glycidoxyethyltrimethoxysilane, β-glycidoxyethyltriethoxysilane, β-glycidoxyethyl-tripropoxysilane, β-glycidoxyethyl-tributoxysilane, β-glycidoxyethyltrimethoxysilane, α-glycidoxyethyl-triethoxysilane, α-glycidoxyethyl-tripropoxysilane, α-glycidoxyethyltributoxysilane, γ-glycidoxypropyl-trimethoxysilane, γ-glycidoxypropyl-triethoxysilane, γ-glycidoxypropyl-tripropoxysilane, γ-glycidoxypropyltributoxysilane, β-glycidoxypropyl-trimethoxysilane, β-glycidoxypropyl-triethoxysilane, β-glycidoxypropyl-tripropoxysilane, β-glycidoxypropyl-tributoxysilane, α-glycidoxypropyl-trimethoxysilane, α-glycidoxypropyl-triethoxysilane, α-glycidoxypropyl-tripropoxysilane, α-glycidoxypropyltributoxysilane, γ-glycidoxybutyl-trimethoxysilane, δ-glycidoxybutyl-triethoxysilane, δ-glycidoxybutyl-tripropoxysilane, δ-glycidoxybutyl-tributoxysilane, δ-glycidoxybutyl-trimethoxysilane, γ-glycidoxybutyl-triethoxysilane, γ-glycidoxybutyl-tripropoxysilane, γ-propoxybutyl-tributoxysilane, δ-glycidoxybutyl-trimethoxysilane, δ-glycidoxybutyl-triethoxysilane, δ-glycidoxybutyl-tripropoxysilane, α-glycidoxybutyl-trimethoxysilane, α-glycidoxybutyl-triethoxysilane, α-glycidoxybutyl-tripropoxysilane, α-glycidoxybutyl-tributoxysilane, (3,4-epoxycyclohexyl)-methyl-trimethoxysilane, (3,4-epoxycyclohexyl)methyl-triethoxysilane, (3,4-epoxycyclohexyl)methyl-tripropoxysilane, (3,4-epoxycyclohexyl)-methyl-tributoxysilane, (3,4-epoxycyclohexyl)ethyl-trimethoxysilane, (3,4-epoxycyclohexyl)ethyl-triethoxysilane, (3,4-epoxycyclohexyl)ethyl-tripropoxysilane, (3,4-epoxycyclohexyl)-ethyl-tributoxysilane, (3,4-epoxycyclohexyl)propyl-trimethoxysilane, (3,4-epoxycyclohexyl)propyl-triethoxysilane, (3,4-epoxycyclohexyl)propyl-tripropoxysilane, (3,4-epoxycyclohexyl)propyl-tributoxysilane, (3,4-epoxycyclohexyl)butyl-trimethoxysilane, (3,4-epoxycyclohexyl) butyl-triethoxysilane, (3,4-epoxycyclohexyl)-butyl-tripropoxysilane, and (3,4-epoxycyclohexyl)butyl-tributoxysilane.

Particularly preferred epoxyalkylalkoxysilanes are γ-glycidoxypropyl trimethoxy silane, γ-glycidoxypropylmethyldiethoxysilane and beta-(3,4-epoxycyclohexyl)ethyl-trimethoxysilane.

Examples of more epoxy-terminated silanes useful in the present invention are described, for example, in U.S. Pat. Nos. 4,049,861 and 4,293,606, and include compounds of the general formulae:

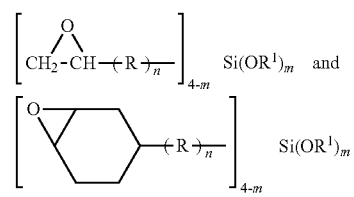

where R=a non-hydrolyzable divalent hydrocarbon radical (aliphatic, aromatic, or aliphatic and aromatic containing) of less than 20 carbon atoms or a divalent radical of less than 20 carbon atoms composed of C, H, N, S, and O atoms (these atoms are the only atoms which may appear in the backbone of the divalent radicals), the last being in the form of either linkages. No two heteroatoms may be adjacent within the backbone of the divalent hydrocarbon radical. This description defines divalent hydrocarbon radicals for epoxy terminated siloxanes in the practice of this invention. The value of n is from 0 to 1, $R^1$ is an aliphatic hydrocarbon radical of less than 10 carbon atoms, an acyl radical of less than 10 carbon atoms, or a radical of formula $(CH_2CH_2O)_k Z$ in which k is an integer of at least 1 and Z is an aliphatic hydrocarbon radical of less than 10 carbon atoms or hydrogen, m has values of 1 to 3.

The epoxy silanes used in this invention can be an epoxy silane of the above formula in which R is any divalent hydrocarbon radical such as methylene, ethylene, decalene, phenylene, cyclohexylene, cyclopentylene, methylcyclohexylene, 2-ethylbutylene, and allene or an ether radical such as —CH$_2$—CH$_2$—O—CH$_2$—CH$_2$—, (CH$_2$—CH$_2$O)$_2$—CH$_2$—CH$_2$—,

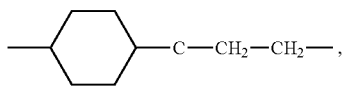

and CH$_2$O—(CH$_2$)$_3$—, R$^1$ can be any aliphatic hydrocarbon radical of less than 10 carbon atoms such as methyl, ethyl, isopropyl, butyl, vinyl, alkyl, or any acyl radical of less than 10 carbon atoms such as formyl, acetyl, propionyl, or any radical of the formula (CH$_2$CH$_2$O)$_k$Z in which k is an integer of at least 1, for example 2, 5, and 8, and Z is hydrogen or any aliphatic hydrocarbon radical of less than 10 carbon atoms such as methyl, ethyl, isopropyl, butyl, vinyl and allyl.

The following compounds are illustrative of some of the epoxy-terminated silanes that are useful in the present invention:

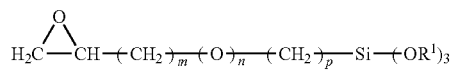

wherein
m is 1 to 6 (preferably 1 to 4),
n is 0 or 1 (preferably 1),
p is 1 to 6 (preferably 1 to 4), and
R$^1$ is H or alkyl of 1 to 10 carbon atoms (preferably alkyl of 1 to 4 carbon atoms).

In addition to any of the above epoxy silanes, partially hydrolyzed or condensated epoxy silane, which are further curable under photo-irradiation in the presence of photo-acid generator are useful in the present invention, alone or blended with non-hydrolyzed epoxy silane. These partial hydrolyzates can be formed by the partial hydrolysis of the silane OR$^1$ groups. Thus the term precondensate includes siloxanes in which some or all of the silicon atoms are bonded through oxygen atoms. Prepolymers are formed by the polymerization of groups other than the silanes as in U.S. Pat. Nos. 4,100,134 and 7,037,585.

Epoxy silanes typically comprise at least about 90% by weight of the hardcoat composition. Preferably, they comprise from about 90% by weight to about 98% by weight of the composition.

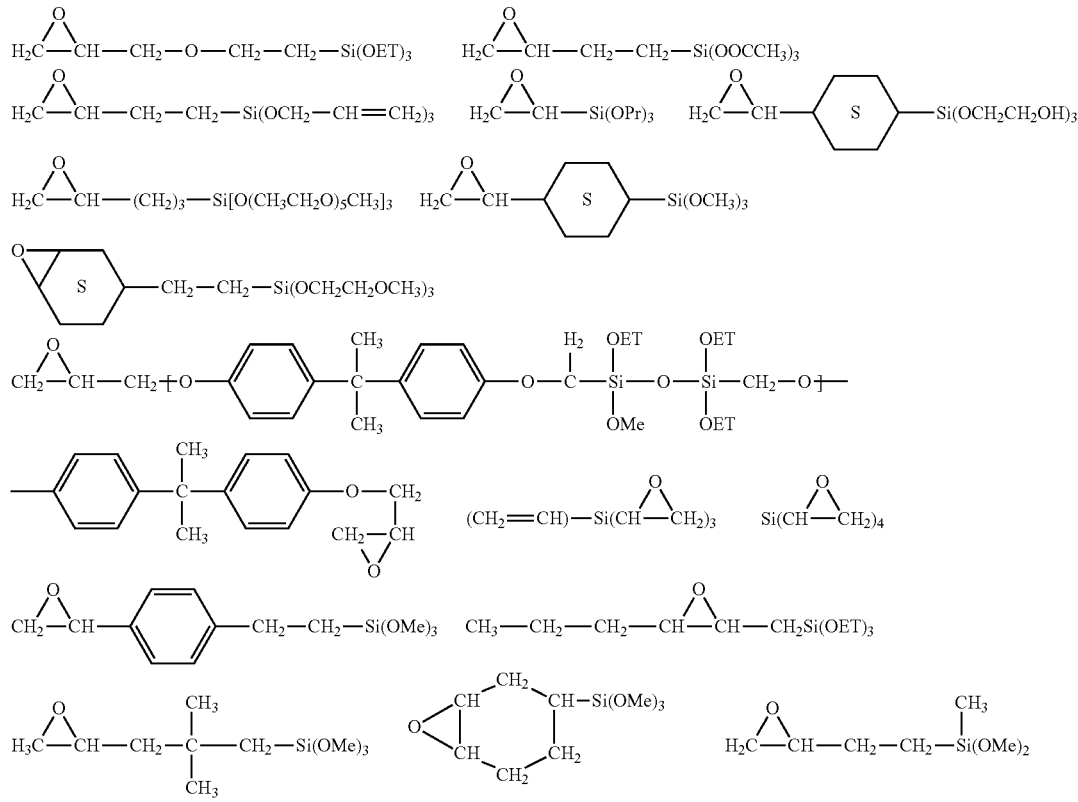

The preparation of most of the above epoxy-terminated silane compounds has been described in U.S. Pat. No. 3,131,161.

Other useful epoxy-terminated silanes are those of the formula:

Fluorochemical Additives

The hardcoat compositions of the invention also comprise a fluorochemical additive such as, for example, a perfluoropolyether-urethane silane or a silane-functionalized perfluoropolyether acrylate oligomer. The epoxy silanes described above and the fluorochemical additives crosslink with themselves and with each other in the presence of acid generated, for example, by cationic photo-initiator, giving the composition durability. In addition, the fluorochemical imparts release properties.

Fluorochemical additive typically comprises from about 0.1% by weight to about 10% by weight of the composition (preferably, from about 0.5% by weight to about 5% by weight of the composition).

In some embodiments the fluorochemical additive is a silane-functionalized perfluoropolyurethane. These compounds can comprise the reaction product of (a) one or more poly-isocyanate functionalized compounds; (b) one or more isocyanate-reactive perfluoropolyether compounds; and (c) one or more isocyanate-reactive silane compounds. They may also optionally comprise one or more additional isocyanate-reactive compounds and/or isocyanate addition catalyst.

Some isocyanate-reactive silanes are of the following formula:

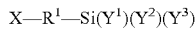

wherein:
X is —NH$_2$; —SH; —OH; —N=C=O; or —NRH where R is a phenyl, straight or branched aliphatic, alicyclic, or a aliphatic ester group;
$R^1$ is an alkylene, heteroalkylene, aralkylene, or heteroaralkylene group; and
each of $Y^1$, $Y^2$ and $Y^3$ is independently a hydroxyl; a hydrolyzable moiety selected from the group consisting of alkoxy, acyloxy, heteroalkyoxy, heteroacyloxxy, halo, and oxime; or a non-hydrolyzable moiety selected from the group consisting of phenyl, alicyclic, straight-chain aliphatic, and branched-chain aliphatic, wherein at least one of $Y^1$, $Y^2$ or $Y^3$ is a hydrolyzable moiety.

Each fluorochemical urethane compound comprises at least one urethane group, preferably at least two urethane linkages, that is derived or derivable from the reaction of at least one polyfunctional isocyanate compound and at least one isocyanate-reactive perfluoropolyether compound. The fluorochemical urethane compound is terminated, on average, with (i) one or more perfluoroalkyl groups, one or more perfluoroheteroalkyl groups; and (ii) one or more silyl groups. It will be understood that the reaction product will provide a mixture of compounds, some percentage of which will comprise compounds as described, but may further comprise urethane compounds having different substitution patterns and degree of substitution.

Useful silane-functionalized perfluoropolyurethanes are disclosed, for example, in U.S. Patent Application Pub. No. 2009/0025727. Such perfluoropolyether urethanes are of the formula:

$$(R_f)_x-[-R^1-(R^{si})_y]_z \qquad (1)$$

wherein
$R_f$ is a fluorine-containing group that includes a perfluorooxyalkyl group or a perfluorooxyalkylene group with the formula:

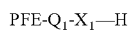

wherein
PFE is perfluoropolyether,
$Q_1$ is a divalent space group,
$X_1$ is an isocyanate reactive group selected from O, S, and NR,
wherein R is H, aryl, or a lower alkyl of 1 to 4 carbon atoms,
$R^1$ is the residue of a polyisocyanate having a valence of x+y, $R^{si}$ is a silane-containing moiety of the formula:

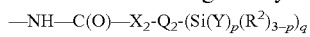

wherein
$Q_2$ is a connecting group of valency q+1 and at least 2
$X_2$ is an isocyanate reactive group selected from O, S, and NR,
wherein R is H, aryl, or a lower alkyl of 1 to 4 carbon atoms,
Y is a hydrolysable group,
$R^2$ is a monovalent alkyl or aryl group,
p is 1, 2 or 3, and
q is from 1 to 6,
x and y are each independently at least 1, and
z is at least 1.

$Q_1$ and $Q_2$ can each independently be a straight or branched chain or cycle-containing connecting group. $Q_1$ and $Q_2$ can include covalent bonds, an alkylene, an arylene, an aralkylene, or an alkarylene. Optionally, $Q_1$ and $Q_2$ can include heteroatoms such as O, N, and S, and combinations thereof. $Q_1$ and $Q_2$ can also optionally include a heteroatom-containing functional group such as carbonyl or sulfonyl and combinations thereof.

One useful example of an additive of Formula (1) has the Formula (1A):

$$(R_f^1Q_1X_1C(O)NH)_m-R_i-(NHC(O)X_2Q_2(Si(Y_1)_p(R^2)_{3-p})_q)_n \qquad (1A)$$

wherein
$R_i$ is a residue of a multi-isocyanate,
$X_1$, $X_2$, $Q_1$, and $Q_2$ are as defined above,
$R_f^1$ is a monovalent perfluoropolyether moiety that includes groups of the formula

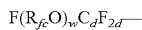

wherein
each $R_{fc}$ independently represents a fluorinated alkylene group having from 1 to 6 carbon atoms,
each w independently represents an integer of at least 2, and
d is an integer from 1 to 6,
$Y_1$ is a hydrolysable group selected from —$OR_2$ and —OC(O)$R_2$, wherein $R_2$ is a lower alkyl of 1 to 4 carbon atoms,
$R^2$ is a monovalent alkyl or aryl group,
m is at least 1,
n is at least 1,
p is 1, 2 or 3,
q is from 1 to 6,
m+n is from 2 to 10, and
each unit referred to by the subscripts m and n is attached to an $R_i$ unit.

By their method of synthesis, the additives of Formula (1) are necessarily mixtures. In Formula (1A), for example, if the mole fraction of isocyanate groups is arbitrarily given a value of 1.0, then the total mole fraction of m and n units used in making the additive of Formula (1A) is at least 1.0. The mole fractions of m:n are from 0.95:0.05 to 0.05:0.95, from 0.50:0.50 to 0.05:0.95, from 0.25:0.75 to 0.05:0.95 or even from 0.25:0.75 to 0.10:0.95. In the instances the mole fractions of m:n total more than one, such as 0.15:0.90, the m unit is reacted onto the isocyanate first, and a slight excess (for example, 0.05 mole fraction) of the n units are used.

In a formulation, for instance, in which 0.15 mole fractions of m and 0.85 mole fraction of n units are introduced, a distribution of products is formed in which some fraction of products formed contain no m units. There will, however, be present in this product distribution, the additives of Formulas (1) and (1A).

A variety of compounds that include hydrolysable silane groups that are isocyanate reactive, or that may add freeradically or in Michael fashion to unsaturated double bonds, are suitable including, for example, $H_2N(CH_2)_3Si(OCH_3)_3$, $H(CH_3)N(CH_2)_3Si(OCH_3)_3$, $HS(CH_2)_3Si(OCH_3)_3$, and $HN((CH_2)_3Si(OCH_3)_3)_2$.

One useful example of Formula 1A has the structure below (1A-1):

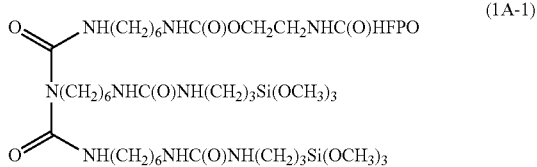

which is the reaction product of the biuret of 1,6-hexamethylene diisocyanate (HDI) with one equivalent of HFPO oligomer amidol (for example, $F(CF(CF_3)CF_2O)_{xx}CF(CF_3)C(O)NHCH_2CH_2OH$, where the average value of xx is about 6.5), followed by reaction with two equivalents of 3-aminopropyl trimethoxysilane.

Another example of an additive of Formula (1) is shown below as structure (1A-2):

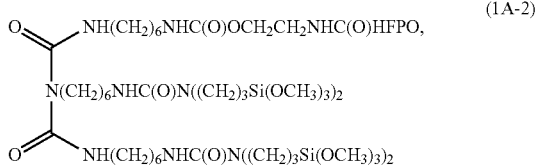

which is the reaction product of the biuret of HDI with one equivalent of HFPO oligomer amidol (for example, $F(CF(CF_3)CF_2O)_{xx}CF(CF_3)C(O)NHCH_2CH_2OH$, where the average value of xx is about 6.5), followed by reaction with two equivalents of bis(3-trimethoxysilylpropyl)amine.

Another useful example of Formula 1A has the structure below (1A-3):

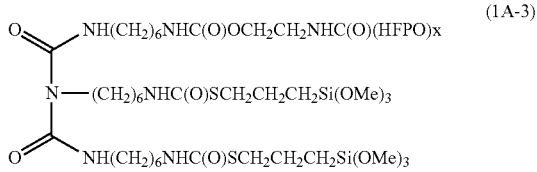

which is the reaction product of the biuret of 1,6-hexamethylene diisocyanate (HDI) with one equivalent of HFPO oligomer amidol (for example, $F(CF(CF_3)CF_2O)_{xx}CF(CF_3)C(O)NHCH_2CH_2OH$, where the average value of xx is about 6.5), followed by reaction with two equivalents of 3-mercaptopropyl trimethoxysilane.

Another useful example of Formula 1A has the structure below (1A-4):

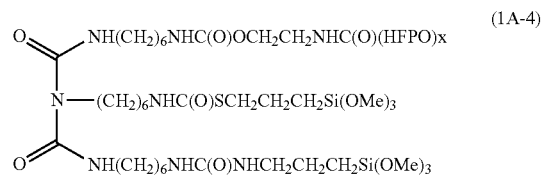

which is the reaction product of the biuret of 1,6-hexamethylene diisocyanate (HDI) with one equivalent of HFPO oligomer amidol (for example, $F(CF(CF_3)CF_2O)_{xx}CF(CF_3)C(O)NHCH_2CH_2OH$, where the average value of xx is about 6.5), followed by reaction with one equivalents of 3-mercaptopropyl trimethoxysilane and one equivalents of 3-aminopropyl trimethoxysilane.

Useful additives of Formula (1) and methods of making the same are disclosed in U.S. Patent Application Nos. 2005/0054804 (Dams et al.), 2005/0121644 (Dams et al.), and 2004/0147188 (Johnson et al.) and U.S. Pat. No. 7,097,910 (Moore et al.).

In some embodiments of Formula (1), $R^{si}$ is of the formula (1B)

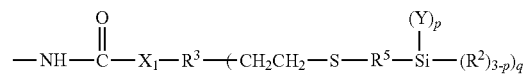

wherein
$X_1$ is O, S, or NR, wherein R is H, aryl, or a lower alkyl of 1 to 4 carbon atoms,
$R^3$ is a polyvalent group that includes alkylene, arylene or a combination thereof (for example, an alkarylene group), the alkylene group optionally including at least one catenary oxygen atom,
$R^5$ is a divalent alkylene group, the alkylene group optionally including at least one catenary oxygen atom,
Y is a hydrolysable group,
$R^2$ is a monovalent alkyl or aryl group,
p is 1, 2 or 3, and
q is 1 to 6,
x and y are each independently at least 1, and
z is at least 1.

Formula 1B can be prepared according to the following reaction:

$(R_f^1Q_1X_1C(O)NH)_m$—$R^i$—$(NHC(O)X_1Q(OCH_2CH_2=CH_2)_n+nHS$—$R^3$—$Si(Y_1)_p(R^2)_{3-p})$→$(R_f^1Q_1X_1C(O)NH)_m$—$R^i$—$(NHC(O)X_1Q(OCH_2CH_2CH_2S$—$R^5$—$Si(Y_1)_p(R^2)_{3-p})_q)_n$ (1B)

wherein all groups are as defined above.

A useful example of Formula 1B is shown below as the structure of Formula

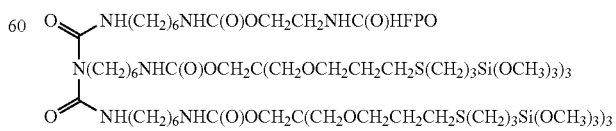

which can be obtained by the reaction of the biuret of 1,6-hexamethylene diisocyanate (HDI) with one equivalent of HFPO oligomer amidol (for example, F(CF(CF$_3$)CF$_2$O)$_{xx}$CF(CF$_3$)C(O)NHCH$_2$CH$_2$OH, where the average value of xx is about 6.5), followed by reaction with pentaerythritol triallyl ether, followed by free radical addition of HS(CH$_2$)$_3$Si(OCH$_3$)$_3$ to the allyl ethers.

In other embodiments of Formula (1), R$^{si}$ is a silane-containing moiety derived from the Michael reaction between a nucleophilic acryloyl compound and an amino silane. Preferably, R$^{si}$ is of the formula (1C)

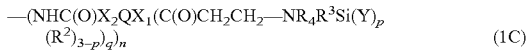
—(NHC(O)X$_2$QX$_1$(C(O)CH$_2$CH$_2$—NR$_4$R$^3$Si(Y)$_p$(R$^2$)$_{3-p}$)$_q$)$_n$   (1C)

wherein R$_4$ is R$^3$Si(Y)$_p$(R$^2$)$_{3-p}$ or R$^2$, X$_2$ is —O— or —S—, preferably —O, and all other groups are defined as above.

One example of a useful additive according to Formula (1) wherein R$^{si}$ is 1C is the additive of the following:

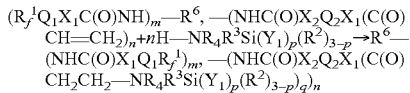
(R$_f^1$Q$_1$X$_1$C(O)NH)$_m$—R$^6$, —(NHC(O)X$_2$Q$_2$X$_1$(C(O)CH=CH$_2$)$_n$+nH—NR$_4$R$^3$Si(Y$_1$)$_p$(R$^2$)$_{3-p}$→R$^6$—(NHC(O)X$_1$Q$_1$R$_f^1$)$_m$, —(NHC(O)X$_2$Q$_2$X$_1$(C(O)CH$_2$CH$_2$—NR$_4$R$^3$Si(Y$_1$)$_p$(R$^2$)$_{3-p}$)$_q$)$_n$ wherein all groups are as defined above.

A useful example of fluorochemical additive according to Formula (1C) is below:

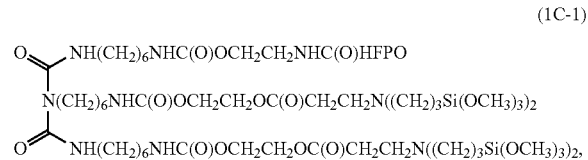
(1C-1)

O=C(NH(CH$_2$)$_6$NHC(O)OCH$_2$CH$_2$NHC(O)HFPO)
N(CH$_2$)$_6$NHC(O)OCH$_2$CH$_2$OC(O)CH$_2$CH$_2$N((CH$_2$)$_3$Si(OCH$_3$)$_3$)$_2$
O=C(NH(CH$_2$)$_6$NHC(O)OCH$_2$CH$_2$OC(O)CH$_2$CH$_2$N((CH$_2$)$_3$Si(OCH$_3$)$_3$)$_2$), which is the reaction product of the biuret of HDI with one equivalent of HFPO oligomer amidol (e.g., F(CF(CF$_3$)CF$_2$O)$_{xx}$CF(CF$_3$)C(O)NHCH$_2$CH$_2$OH, where the average value of xx is about 6.5), followed by reaction with two equivalents of hydroxyethylacrylate, followed by Michael reaction of the acrylate groups with bis(3-trimethoxysilylpropyl)amine.

Polyfunctional isocyanate compounds useful in the present invention comprise isocyanate groups attached to the multivalent organic group, Q, which can comprise a multivalent aliphatic, alicyclic, or aromatic moiety; or a multivalent aliphatic, alicyclic or aromatic moiety attached to a blocked isocyanate, a biuret, an isocyanurate, or a uretdione, or mixtures thereof. Preferred polyfunctional isocyanate compounds contain at least two and preferably three or more —NCO groups. Compounds containing two —NCO groups are comprised of divalent aliphatic, alicyclic, araliphatic, or aromatic moieties to which the —NCO radicals are attached. Preferred compounds containing three —NCO radicals are comprised of isocyanatoaliphatic, isocyanatoalicyclic, or isocyanatoaromatic, monovalent moieties, which are attached to a biuret or an isocyanurate.

Preferred polyisocyanates, in general, include those selected from the group consisting of hexamethylene 1,6-diisocyanate (HDI), 1,12-dodecane diisocyanate isophorone diisocyanate, toluene diisocyanate, dicyclohexylmethane 4,4'-diisocyanate, MDI, derivatives of all the aforementioned, including Desmodur™ N-100, N-3200, N-3300, N-3400, N-3600, and mixtures thereof.

Suitable fluorochemical monofunctional compounds include those that comprise at least one perfluoropolyether ("R$_f$") group. The perfluoropolyether group R$_f$ can be linear, branched, cyclic, or combinations thereof and can be saturated or unsaturated. The perfluoropolyether has at least two catenated oxygen heteroatoms. Exemplary perfluoropolyethers include, but are not limited to, those that have perfluorinated repeating units selected from the group of —(C$_p$F$_{2p}$)—, —(C$_p$F$_{2p}$O)—, —(CF(Z))—, —(CF(Z)O)—, —(CF(Z)C$_p$F$_{2p}$O)—, —(C$_p$F$_{2p}$CF(Z)O)—, —(CF$_2$CF(Z)O)—, or combinations thereof. In these repeating units, p is typically an integer of 1 to 10. In some embodiments, p is an integer of 1 to 8, 1 to 6, 1 to 4, or 1 to 3. The group Z is a perfluoroalkyl group, perfluoroether group, perfluoropolyether, or a perfluoroalkoxy group, all of which can be linear, branched, or cyclic. The Z group typically has no more than 12 carbon atoms, no more than 10 carbon atoms, or no more than 9 carbon atoms, no more than 4 carbon atoms, no more than 3 carbon atoms, no more than 2 carbon atoms, or no more than 1 carbon atom. In some embodiments, the Z group can have no more than 4, no more than 3, no more than 2, no more than 1, or no oxygen atoms. In these perfluoropolyether structures, the different repeat units can be distributed randomly along the chain.

R$_f$ can be monovalent or divalent. In some compounds where R$_f$ is monovalent, the terminal groups can be (C$_p$F$_{2p+1}$)—, (C$_p$F$_{2p+1}$O)—, (X'C$_p$F$_{2p}$O)—, or (X'C$_p$F$_{2p+1}$)— where X' is hydrogen, chlorine, or bromine and p is an integer of 1 to 10. In some embodiments of monovalent R$_f$ groups, the terminal group is perfluorinated and p is an integer of 1 to 10, 1 to 8, 1 to 6, 1 to 4, or 1 to 3. Exemplary monovalent R$_f$ groups include CF$_3$O(C$_2$F$_4$O)$_n$CF$_2$—, and C$_3$F$_7$O(CF(CF$_3$)CF$_2$O)$_n$CF(CF$_3$)— wherein n has an average value of 0 to 50, 1 to 50, 3 to 30, 3 to 15, or 3 to 10.

Suitable structures for divalent R$_f$ groups include, but are not limited to, —CF$_2$O(CF$_2$O)$_q$(C$_2$F$_4$O)$_n$CF$_2$—, —(CF$_2$)$_3$O(C$_4$F$_8$O)$_n$(CF$_2$)$_3$—, —CF$_2$O(C$_2$F$_4$O)$_n$CF$_2$—, and —CF(CF$_3$)(OCF$_2$CF(CF$_3$))$_s$OC$_t$F$_{2t}$O(CF(CF$_3$)CF$_2$O)$_n$CF(CF$_3$)—, wherein q has an average value of 0 to 50, 1 to 50, 3 to 30, 3 to 15, or 3 to 10; n has an average value of 0 to 50, 3 to 30, 3 to 15, or 3 to 10; s has an average value of 0 to 50, 1 to 50, 3 to 30, 3 to 15, or 3 to 10; the sum (n+s) has an average value of 0 to 50 or 4 to 40; the sum (q+n) is greater than 0; and t is an integer of 2 to 6.

As synthesized, compounds typically include a mixture of R$_f$ groups. The average structure is the structure averaged over the mixture components. The values of q, n, and s in these average structures can vary, as long as the compound has a number average molecular weight of at least about 400. Useful compounds often have a molecular weight (number average) of 400 to 5000, 800 to 4000, or 1000 to 5000.

Other preferred classes of fluorochemical additive include polyurethanes further extended by a multi-alcohol (disclosed, for example, in U.S. Pat. No. 6,646,088 (Fan et al.)) can be represented by the following formulas:

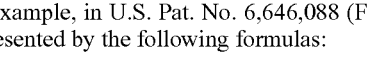
R$_f$ZR$^2$—X'—(CONH-Q(A)$_m$-NHCOX'R$^3$
X'—)$_n$CONH-Q(A)-NHCO—X'R$^1$Si(Y)$_3$ R$_f$ZR$^2$—X'—(CONH-Q(A)$_m$-NHCO—X'R$^3$
X'—)$_n$CONHR$^1$Si(Y)$_3$ wherein:

R$_f$ZR$^2$— is a residue of at least one of the fluorochemical monofunctional compounds;

R$_f$ is a perfluoropolyether group;

Z is a covalent bond, sulfonamido (—SO$_2$NR—), or carboxamido (—CONR—) where R is hydrogen or alkyl;

R$^1$ is an alkylene, heteroalkylene, aralkylene, or heteroaralkylene group;

R$^2$ is a divalent straight or branched chain alkylene, cycloalkylene, or heteroalkylene group of 1 to 14 carbon atoms, preferably 1 to 8 carbon atoms, more preferably 1 to 4 carbon atoms, and most preferably two carbon atoms, and preferably $R^2$ is alkylene or heteroalkylene of 1 to 14 carbon atoms;

Q is a multi-valent organic group that is a residue of the polyfunctional isocyanate compound;

$R^3$ is a polyvalent, preferably divalent organic group which is a residue of the hydrophilic polyoxyalkylene;

X' is —O—, —S—, or —N(R)—, wherein R is hydrogen or $C_1$-$C_4$ alkyl;

each Y is independently a hydroxy; a hydrolyzable moiety selected from the group consisting of alkoxy, acyloxy, heteroalkoxy, heteroacyloxy, halo, and oxime; or a non-hydrolyzable moiety selected from the group consisting of phenyl, alicyclic, straight-chain aliphatic, and branched-chain aliphatic, wherein at least one Y is a hydrolyzable moiety;

A is selected from the group consisting of $R_fZR^2$—OCONH—, $(Y)_3SiR^1XCONH$—, and $(Y)_3SiR^1NHCOOR^3OCONH$—;

m is an integer from 0 to 2; and n is an integer from 1 to 10.

It will be understood with respect to the above formulas that the compounds represent theoretical structures for the reaction products. The reaction product will contain a mixture of compounds in which the substitution patterns of the isocyanate groups will vary.

Polyols suitable include those organic polyols that have an average hydroxyl functionality of at least about 2 (preferably, about 2 to 5; more preferably, about 2 to 3; most preferably, about 2, as diols are most preferred). The hydroxyl groups can be primary or secondary, with primary hydroxyl groups being preferred for their greater reactivity. Mixtures of diols with polyols that have an average hydroxyl functionality of about 2.5 to 5 (preferably about 3 to 4; more preferably, about 3) can also be used. It is preferred that such mixtures contain no more than about 20 percent by weight of such polyols, more preferably no more than about 10 percent, and most preferably no more than about 5 percent. Preferred mixtures are mixtures of diols and triols.

Suitable polyols include those that comprise at least one aliphatic, heteroaliphatic, alicyclic, heteroalicyclic, aromatic, heteroaromatic, or polymeric moiety. Preferred polyols are aliphatic or polymeric polyols that contain hydroxyl groups as terminal groups or as groups that are pendant from the backbone chain of the polyol.

Preferred polyols include 2,2-bis(hydroxymethyl)propionic acid; N,N-bis(2-hydroxyethyl)-3-aminopropyltriethoxysilane; bicine; 3,5-dihydroxybenzoic acid; 2,4-dihydroxybenzoic acid; N-bis(2-hydroxyethyl)perfluorobutyl sulfonamide; 1,2-ethanediol; 1,2- and 1,3-propanediol; 1,3- and 1,4-butanediol; neopentylglycol; 1,5-pentanediol; 3-methyl-1,5-pentanediol; 1,2-, 1,5-, and 1,6-hexanediol; bis(hydroxymethyl)cyclohexane; 1,8-octanediol; 1,10-decanediol; di(ethylene glycol); tri(ethylene glycol); tetra(ethylene glycol); di(propylene glycol); di(isopropylene glycol); tri(propylene glycol); poly(ethylene glycol) diols (number average molecular weight of about 200 to about 1500); poly(di(ethylene glycol) phthalate) diol (having number average molecular weights of, for example, about 350 or about 575); poly(propylene glycols) diols (number average molecular weight of about 200 to about 500); block copolymers of poly(ethylene glycol) and poly(propylene glycol) such as PLURONIC™ L31 (available from BASF Corporation, Mount Olive, N.J.); polydimethylsiloxane diol; fluorinated oxetane polyols made by the ring-opening polymerization of fluorinated oxetane such as POLY-3-FOX™ (available from Omnova Solutions, Inc., Akron, Ohio); polyetheralcohols prepared by ring opening addition polymerization of a fluorinated organic group substituted epoxide with a compound containing at least two hydroxyl groups as described in U.S. Pat. No. 4,508,916 (Newell et al); perfluoropolyether diols such as FOMBLIN™ ZDOL $(HOCH_2CF_2O(CF_2O)_{8-12}(CF_2CF_2O)_{8-12}CF_2CH_2OH$, available from Ausimont, Inc., Thorofare, N.J.); 1,4-bis(1-hydroxy-1,1-dihydroperfluoroethoxyethoxy)perfluoro-n-butane $(HOCH_2CF_2OC_2F_4O(CF_2)_4OC_2F_4OCF_2CH_2OH)$; 1,4-bis(1-hydroxy-1,1-dihydroperfluoropropoxy)perfluoro-n-butane $(HOCH_2CF_2CF_2O(CF_2)_4OCF_2CF_2CH_2OH)$; polycaprolactone diols (number average molecular weight of about 200 to about 600); resorcinol; hydroquinone; 1,6-, 2,5-, 2,6-, and 2,7-dihydroxynaphthalene; 4,4'-biphenol; bisphenol A; bis (4-hydroxyphenyl)methane; and the like; and mixtures thereof.

More preferred polyols include bis(hydroxymethyl)propionic acid; bicine; N-bis(2-hydroxyethyl)perfluorobutylsulfonamide; 1,2-ethanediol; 1,2- and 1,3-propanediol; 1,4-butanediol; neopentylglycol; 1,2- and 1,6-hexanediol; di(ethylene glycol); tri(ethylene glycol); 1,4-bis(1-hydroxy-1,1-dihydroperfluoropropoxy)perfluoro-n-butane $(HOCH_2CF_2CF_2O(CF_2)_4OCF_2CF_2CH_2OH)$; fluorinated oxetane polyols made by the ring-opening polymerization of fluorinated oxetane such as POLY-3-FOX™ (available from Omnova Solutions, Inc., Akron Ohio); poly(di(ethylene glycol) phthalate) diol (having number average molecular weights of, for example, about 350 or about 575); poly(ethylene glycol) diols (having number average molecular weights of, for example, about 200, 300, 400); polydimethylsiloxane diol; polypropylene glycol (having a number average molecular weight of, for example, about 425); dimer diol; polycaprolactone diol (having a number average molecular weight of, for example, about 530); 3,5-dihydroxybenzene; bisphenol A; resorcinol; hydroquinone; and mixtures thereof.

Another class of isocyanate reactive silanes with hydrolysable groups for making perfluoropolyether urethane silane additive is acrylate oligomer made from the oligomerization of acrylate monomers ($M^{si}$ and $M^h$) and a chain transfer agent with isocyanate reactive group and optionally with additional non-fluorinated acrylate monomers according to Formula (4)

$$X\text{-}[M^{si}]_a[M^h]_b\text{-S-Q-OH} \quad (4),$$

wherein

X represents the residue of an initiator or hydrogen, $M^h$ represents units derived from non-fluorinated acrylate monomers, $M^{si}$ represents units derived from acrylate monomers having a silyl group represented by the formula

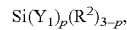

$$Si(Y_1)_p(R^2)_{3-p},$$

wherein $Y_1$ is a hydrolysable group selected from the group of —$OR_2$ and —$OC(O)R_2$, wherein $R_2$ is a lower alkyl of 1 to 4 carbon atoms, $R^2$ is a monovalent alkyl or aryl group, and p is 1, 2 or 3, Q is a divalent organic linking group b is 0 to 20, and a is 1 to 20.

With Formula (4) in replacement of simple isocyanate reactive silanes, X—$R^1$—$Si(Y^1)(Y^2)(Y^3)$, in the described formula above, new perfluoropolyether polyurethane additives with curable acrylate silane oligomer can be obtained, represented by Formula (5):

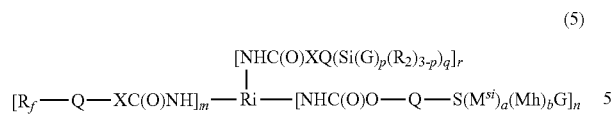

(5)

wherein:
- $R_f$ is a monovalent perfluoropolyether moiety;
- Q is independently a connecting group of valence at least 2, which may contain heteroatoms such as —O—, —S— and —NR$_3$—, and the like;
- X is O, S, or NR, wherein R is H or a lower alkyl of 1 to 4 carbon atoms;
- G is the residue of an initiator or hydrogen;
- Ri is a residue of a multi-isocyanate;
- $M^{si}$ is the radical from acrylate monomer with a curable silane group, —SiY$^1$Y$^2$Y$^3$, wherein Y$^1$, Y$^2$ and Y$^3$ are independently a halogen or a hydrolysable alkoxy group with no more than two alkyl group(s);
- $M^h$ is the radical from one or more hydrocarbon acrylate monomer;
- a is at least 1; b is zero to 20; q is 1 to 4; r is zero to 4; m is at least 1; n is at least 1; p is 1, 2 or 3; q is from 1 to 6; r is from 0 to 6.

Preferably, m+n is from 2 to 10.

Since the molecular weight of acrylate oligomer can be well controlled by the ratio of $M^{si}$, $M^h$ and chain transfer agent, the ratio of perfluoropolyether segment and hydrocarbon segment can be easily adjusted to control its compatibility with coating formulations.

One example of Formula (4) is described below, made from the reaction of the biuret of 1,6-hexamethylene diisocyanate (HDI) with one equivalent of HFPO oligomer amidol (for example, F(CF(CF$_3$)CF$_2$O)$_{xx}$CF(CF$_3$)C(O)NHCH$_2$CH$_2$OH, where the average value of xx is about 6.5), followed by reaction with two equivalents of the oligomer of 3 moles of CH$_2$=CMeCO$_2$CH$_2$CH$_2$CH$_2$Si(OMe)$_3$ and one mole of HSCH$_2$CH$_2$OH.

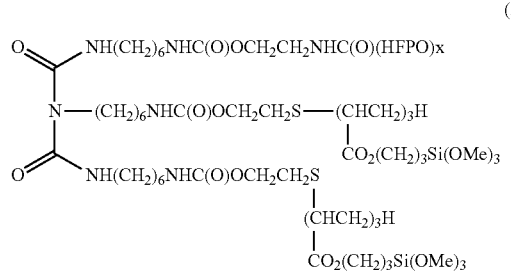

(5A)

Another useful example of Formula (4) is described in Formula (5B), made from the reaction of the biuret of 1,6-hexamethylene diisocyanate (HDI) with one equivalent of HFPO oligomer amidol (for example, F(CF(CF$_3$)CF$_2$O)$_{xx}$CF(CF$_3$)C(O)NHCH$_2$CH$_2$OH, where the average value of xx is about 6.5), followed by reaction with one equivalent of the oligomer of 3 moles of CH$_2$=CMeCO$_2$CH$_2$CH$_2$CH$_2$Si(OMe)$_3$ and one mole of HSCH$_2$CH$_2$OH, and finally the reaction with 3-aminopropyltrimethoxysilane.

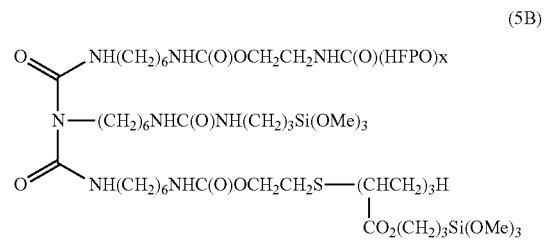

(5B)

Another useful example of Formula (4) is described in Formula (5C), made from the reaction of the biuret of 1,6-hexamethylene diisocyanate (HDI) with one equivalent of HFPO oligomer amidol (for example, F(CF(CF$_3$)CF$_2$O)$_{xx}$CF(CF$_3$)C(O)NHCH$_2$CH$_2$OH, where the average value of xx is about 6.5), followed by reaction with one equivalents of the oligomer of 3 moles of CH$_2$=CMeCO$_2$CH$_2$CH$_2$CH$_2$Si(OMe)$_3$ and one mole of HSCH$_2$CH$_2$OH (OSi-1), and finally the reaction with 3-mercaptopropyltrimethoxysilane.

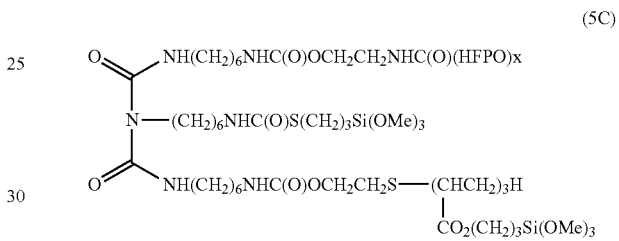

(5C)

The oligomer of silane acrylate could also be co-polymerized with additional acrylate monomers in adjust the performance and compatibility. Formula (6) is prepared from 4 moles of CH$_2$=CMeCO$_2$CH$_2$CH$_2$CH$_2$Si(OMe)$_3$ (A-174), 1 mole of C$_{18}$H$_{37}$OC(O)CH=CH$_2$ (ODA) in the presence of 1 mole of HSCH$_2$CH$_2$OH.

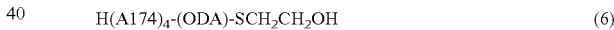

$$H(A174)_4\text{-}(ODA)\text{-}SCH_2CH_2OH \quad (6)$$

Reaction of Formula (6) with the adduct of the biuret of 1,6-hexamethylene diisocyanate (HDI) with one equivalent of HFPO oligomer amidol (for example, F(CF(CF$_3$)CF$_2$O)$_{xx}$CF(CF$_3$)C(O)NHCH$_2$CH$_2$OH, where the average value of xx is about 6.5), followed by the reaction with Formula 6, then 3-aminopropyltrimethoxysilane forms additive, as described in Formula (7) below.

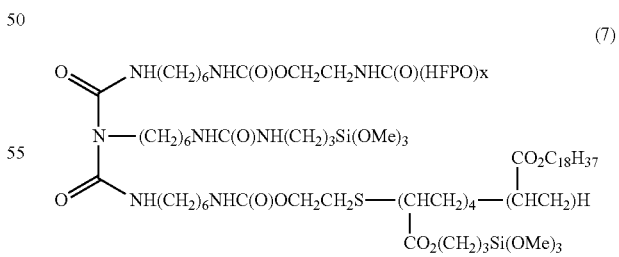

(7)

Useful $M^h$ monomers include acrylates, including, for example, octadecyl acrylate, methyl acrylate, ethyl acrylate, and butyl acrylate.

Useful $M^{si}$ monomers include, for example, vinyltrimethoxysilane, vinyltriethoxysilane, and alkoxysilane functionalized acrylates and methacrylates, including, for example, methacryloyloxypropyl trimethoxysilane.

An oligomer of Formula (OSi) can be obtained in a variety of ways including, for example, by polymerizing three moles of $H_2C=C(CH_3)C(O)O(CH_2)_3Si(OCH_3)$ with one mole of $HSCH_2CH_2CH_2OH$ with a thermal initiator (for example, VAZO-67 thermal initiator, which is commercially available from DuPont), in a nitrogen degassed solvent such as ethyl acetate, at about 70° C. for ten hours.

Additionally, a variety of compounds that include hydrolysable silane groups that are isocyanate reactive may be used to replace a portion of the oligomer of Formula (OSi) to make the perfluoropolyether urethanes with hydrolysable silane groups that are partially derived from an oligomer of the formula (OSi). Examples of such compounds include $H_2N(CH_2)_3Si(OCH_3)_3$, $H(CH_3)N(CH_2)_3Si(OCH_3)_3$, $HS(CH_2)_3Si(OCH_3)_3$, and $HN((CH_2)_3Si(OCH_3)_3)_2$.

In other embodiments, the fluorochemical additive is a reactive silane-functionalized perfluoropolyether acrylate oligomer. For example, the fluorochemical additive may be a silane-functionalized perfluoropolyether acrylate oligomer made from the radical oligomerization of HFPO-(meth)acrylate, silane-(meth)acrylate in the presence of a chain transfer agent, optionally with other acrylate monomer with or without functional groups. Useful reactive silane-functionalized perfluoropolyether acrylate oligomers include those of the following general structure:

$$(M^{si})_a(M^h)_b(M^{HFPO})_cG \qquad (8)$$

wherein:

$M^{si}$ is the radical from acrylate or methacrylate monomer with a curable silane group, $-SiY^1Y^2Y^3$, where in $Y^1$, $Y^2$, and $Y^3$ are independently hydrolysable halogen or alkoxy groups with no more than two alkyl groups;

$M^{HFPO}$ is the radical from perfluoropolyether-containing acrylate or methacrylate monomer; specifically, the perfluoropolyether is made from the oligomerization of hexafluoropropylene oxide (HFPO), $(HFPO)_x$-L-OC(O)CH=CH$_2$ or $(HFPO)x$-L-OC(O)CCH$_3$=CH$_2$ wherein L is a divalent linking group (for example, $-C(O)NHCH_2CH_2-$, $-CH_2CH_2OCH_2CH_2-$, or $-CH_2OCH_2CH_2OCH_2CH_2-$) and x is 3 or greater (preferably, 5 or greater);

$M^h$ is the radical from one or more hydrocarbon acrylate monomers with or without functional group(s);

G is the radical from chain transfer agent with or without functional groups;

optionally, there is a curable silane group -Q-Si(Y$^1$)(Y$^2$)(Y$^3$); and a is at least two; b is 0 to 50; and c is at least 1.

For good solubility in non-fluorinated organic solvent and compatibility with epoxy-silanes, a or a+b is preferred having 50% or more by weight. For better release performance, c is preferred having 10% or more by weight In some embodiments, G corresponds to the Formula:

$$-SQ^1T^2C(O)NHQ^5Si(Y^1)(Y^2)(Y^3)-$$

wherein

Q$^1$ and Q$^5$ each independently represent an organic divalent linking group,

T$^2$ represents O or NR with R being hydrogen, an aryl or a C$_1$-C$_4$ alkyl group, and Y$^1$, Y$^2$ and Y$^3$ each independently represent an alkyl group, an aryl group or a hydrolysable group with at least one of Y$^1$, Y$^2$ and Y$^3$ representing a hydrolysable group.

$M^{HFPO}$ is the residue of acrylate monomer with perfluoropolyether segment with the following general structure:

$$R_fQX-C(O)CR=CH_2$$

wherein

R$_f$ is a monovalent perfluoropolyether moiety as identified above; More specifically, Rf is the oligomer of hexafluoropropene oxide with molecular weight at least 1,000;

Q is independently a connecting group of valence at least 2, which may contain heteroatoms such as $-O-$, $-S-$ and $-NR_3-$, and the like;

X is O, S, or NR, wherein R is H or a lower alkyl of 1 to 4 carbon atoms;

Examples of suitable fluorochemical monomers for $M^{HFPO}$ include $C_3F_7O(CF(CF_3)CF_2O)_uCF(CF_3)CH_2OC(O)CH=CH_2$, $C_3F_7O(CF(CF_3)CF_2O)_uCF(CF_3)CH_2OC(O)C(CH_3)=CH_2$, $C_3F_7O(CF(CF_3)CF_2O)_uCF(CF_3)CH_2OCH_2CH_2C(O)CH=CH_2$, $C_3F_7O(CF(CF_3)CF_2O)_uCF(CF_3)CH_2OCH_2CH_2OC(O)C(CH_3)=CH_2$, $C_3F_7O(CF(CF_3)CF_2O)_uCF(CF_3)C(O)NHCH_2CH_2OC(O)CH=CH_2$, $C_3F_7O(CF(CF_3)CF_2O)_uCF(CF_3)C(O)NHCH_2CH_2OC(O)C(CH_3)=CH_2$, $CH_2=CHC(O)OCH_2CF_2(OCF_2)_u(OCF_2CF_2)_vOCF_2CH_2OC(O)CH=CH_2$, and $CH_2=C(CH_3)C(O)OCH_2CF_2(OCF_2)_u(OCF_2CF_2)_vOCF_2CH_2OC(O)C(CH_3)=CH_2$, wherein u and v are independently 1 to 50.

The fluorochemical silane can be prepared through a free radical polymerization of a fluorinated monomer, optionally with a non-fluorinated monomer and a monomer that includes the silyl group, in the presence of a chain transfer agent. A free radical initiator can be used to initiate the polymerization or oligomerization reaction. Suitable free-radical initiators include, for example, azo compounds, such as azobisisobutyronitrile (AIBN) and azo-2-cyanovaleric acid, hydroperoxides (for example, cumene, t-butyl and t-amyl hydroperoxide, dialkyl peroxides such as di-t-butyl and dicumylperoxide), peroxyesters such as t-butylperbenzoate and di-t-butylperoxy phthalate, diacylperoxides such as benzoyl peroxide and lauroyl peroxide.

The oligomerization reaction can be carried out in any solvent suitable for organic free-radical reactions. The reactants can be present in the solvent at any suitable concentration including, for example, from about 5% by weight to about 90% by weight based on the total weight of the reaction mixture. Suitable solvents include, for example, aliphatic and alicyclic hydrocarbons (for example, hexane, heptane, cyclohexane), aromatic solvents (for example, benzene, toluene, xylene), ethers (for example, diethylether, glyme, diglyme, diisopropyl ether), esters (for example, ethyl acetate, butyl acetate), alcohols (for example, ethanol, isopropyl alcohol), ketones (for example, acetone, methylethyl ketone, methyl isobutyl ketone), sulfoxides (for example, dimethyl sulfoxide), amides (for example, N,N-dimethylformamide, N,N-dimethylacetamide), halogenated solvents such as methylchloroform, FREON 113, trichloroethylene, alpha,alpha,alpha-trifluorotoluene, and mixtures thereof.

The oligomerization reaction can be carried out at any temperature suitable for conducting an organic free-radical reaction. Particular temperature and solvents for use can be easily selected based on considerations such as the solubility of reagents, the temperature required for the use of a particular initiator, and desired molecular weight. While it is not practical to enumerate a particular temperature suitable for all initiators and all solvents, generally suitable temperatures are from about 30° C. and about 200° C.

The fluorochemical oligomer is prepared in the presence of chain transfer agent. Suitable chain transfer agents include, for example, a hydroxy-, amino-, mercapto and halogen groups. The chain transfer agent can include at least two of such hydroxy, amino-, mercapto and halogen groups. Illustrative examples of chain transfer agents useful in the preparation of the fluorochemical oligomer include 2-mercaptoethanol, 3-mercapto-2-butanol, 3-mercapto-2-propanol, 3-mercapto-1-propanol, 3-mercapto-1,2-propanediol, 2-mercapto-ethylamine, di(2-mercaptoethyl)sulfide, octylmercaptan, and dodecylmercaptan.

In one useful embodiment, a chain transfer agent that includes a silyl group having at least one hydrolyzable groups is used in the oligomerization to produce the fluorochemical oligomer. Useful chain transfer agent that include such a silyl group include chain transfer agents of Formula:

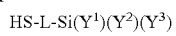

HS-L-Si($Y^1$)($Y^2$)($Y^3$)

wherein

L represents a divalent linking group, and $Y^1$, $Y^2$ and $Y^3$ each independently represents an alkyl group, preferably a $C_1$-$C_8$ alkyl group such as methyl, ethyl and propyl, an alkyl group containing a cycloalkyl such as cyclohexyl and cyclopentyl, an aryl group such as phenyl, an alkylaryl group, an aralkyl group, and a hydrolysable group such as a halogen or an alkoxy group such as methoxy, ethoxy or an aryloxy group, where at least one of $Y^1$, $Y^2$ and $Y^3$ represents a hydrolysable group.

A single chain transfer agent or a mixture of different chain transfer agents can be used. Useful chain transfer agents are 2-mercaptoethanol, octylmercaptane and 3-mercaptopropyl-trimethoxysilane. A chain transfer agent is preferably present in an amount sufficient to control the number of polymerized monomer units in the oligomer and to obtain the desired molecular weight of the oligomeric fluorochemical silane. The chain transfer agent is generally used in an amount of about 0.05 equivalents to about 0.5 equivalents, preferably about 0.25 equivalents, per equivalent of monomer including fluorinated and non-fluorinated monomers. One example of a useful commercially available chain transfer agent is A-160 HS(CH$_2$)$_3$Si(OCH$_3$)$_3$ from Sigma-Aldrich Chemical Company (Milwaukee, Wis.).

In a preferred embodiment, the silane-functionalized perfluoropolyether acrylate oligomer has the following general structure:

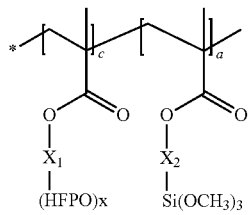

wherein:

HFPO is $C_3F_7O(CF(CF_3)CF_2O)_nCF(CF_3)$— wherein n averages from 1 to 50;

$X_1$ is a divalent linkage;

$X_2$ is a divalent linkage;

x is at least 3 (preferably, at least 5);

c is at least 1; and a is at least 1.

Photoacid Generator

Photoacid generators are cationic photoinitiators. The hardcoat compositions used in the present invention comprise a photoacid generator to cationically polymerize the composition using ultraviolet (UV) light. Useful cationic photoinitiators include diaryliodonium salts, triarylsulfonium salts benzylsulfonium salts, phenacylsulfonium salts, N-benzylpyridinium salts, N-benzylpyrazinium salts, N-benzylammonium salts, phosphonium salts, hydrazinium salts, and ammonium borate salts.

Useful cationic initiators for the purposes of this invention also include the aromatic onium salts, including salts of Group Va elements, such as phosphonium salts, for example, triphenyl phenacylphosphonium hexafluorophosphate, salts of Group VIa elements, such as sulfonium salts, for example, triphenylsulfonium tetrafluoroborate, triphenylsulfonium hexafluorophosphate and triphenylsulfonium hexafluoroantimonate, and salts of Group VIIa elements, such as iodonium salts such as diphenyliodonium chloride and diaryl iodonium hexafluoroantimonate, the latter being preferred. The aromatic onium salts and their use as cationic initiators in the polymerization of epoxy compounds are described in detail in U.S. Pat. No. 4,058,401, "Photocurable Compositions Containing Group VIA Aromatic Onium Salts," by J. V. Crivello issued Nov. 15, 1977; U.S. Pat. No. 4,069,055, "Photocurable Epoxy Compositions Containing Group VA Onium Salts," by J. V. Crivello issued Jan. 17, 1978, U.S. Pat. No. 4,101,513, "Catalyst For Condensation Of Hydrolyzable Silanes And Storage Stable Compositions Thereof," by F. J. Fox et al. issued Jul. 18, 1978; and U.S. Pat. No. 4,161,478, "Photoinitiators," by J. V. Crivello issued Jul. 17, 1979.

Other cationic initiators can also be used in addition to those referred to above; for example, the phenyldiazonium hexafluorophosphates containing alkoxy or benzyloxy radicals as substituents on the phenyl radical as described in U.S. Pat. No. 4,000,115, "Photopolymerization Of Epoxides," by Sanford S. Jacobs issued Dec. 28, 1976. Preferred cationic initiators for use in the compositions of this invention are the salts of Group VIa elements and especially the sulfonium salts, and also the Group VIIa elements, particularly the diaryl iodonium hexaflurorantimonates. Particular cationic catalysts include diphenyl iodonium salts of tetrafluoro borate, hexafluoro phosphate, hexafluoro arsenate, and hexafluoro antimonate; and triphenyl sulfonium salts of tetrafluoroborate, hexafluoro phosphate, hexafluoro arsenate, and hexafluoro antimonate.

Cyracure™ UVI-6976 (a mixture of triarylsulfonium hexafluoroantimonate salts in propylene carbonate) and UVI-6992 are examples of cationic photoinitiators available from Dow Chemical. Darocur™ 1173 cationic photoinitator can be obtained from Ciba Geigy Co.

Cationic initiator is typically present in the compositions of the invention in a range from about 1% to about 5% by weight.

Optional Components

The hardcoat compositions can further comprise one or more diepoxide compounds. Diepoxide compounds can, for example, accelerate polymerization of the composition. They can also be used to adjust the softness or to reduce brittleness of the cured composition.

Suitable diepoxide comonomers include those disclosed in U.S. Pat. No. 4,293,606 (Zollinger et al.) of the formula:

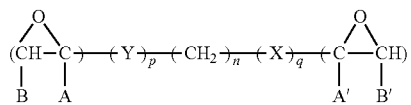

wherein n=1 to 6, X and Y independently represent (1) —O—(—CH$_2$)$_m$—, wherein m=1 or 2 and the terminal carbon atom of this group is directly connected to the carbon of the epoxy group, or

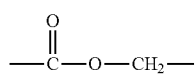 (2)

with the bond from the carbonyl carbon atom directly connected to the bridging group —(—CH$_2$—)—$_n$, p+q=1 or 2 and p and q are independently 0 or 1, A and B, and A' and B' are independently H or, when fused together as A and B or A' and B', the atoms necessary to form a 5- or 6-membered cycloaliphatic ring, and

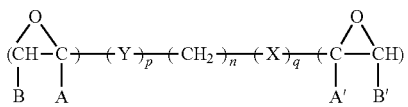

wherein A and B and A' and B' are as defined above r and u are independently integers of 1 to 6, and s is an integer of 1 to 6.

Preferably, the diepoxide comonomer is a cycloaliphatic diepoxide compound. A preferred diepoxide compound is 3,4-epoxycyclohexylmethy-3,4-epoxycyclohexanecarboxylate.

If used, diepoxide comonomers are typically present in the compositions of the invention in amounts of less than about 40% by weight.

The protective coating compositions of the invention may also comprise other optional components such as, for example, curable mono- and/or di-silanes (for example, to adjust hardness), surfactant, matting agents, inorganic particles, and the like.

In another aspect, the protective coating compositions may also comprise a fluorinated compound disclosed herein and a compound represented by formula:

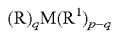

wherein
R is selected from the group consisting of alkyl, aryl, arylalkylenyl, and alkylarylenyl;
M is selected from the group consisting of Si, Ti, Zr, and Al (preferably, M is Si);
R$^1$ is selected from the group consisting of halide, hydroxyl, alkoxy, aryloxy, acyloxy, and polyalkyleneoxy;
p is 3 or 4; and
q is 0, 1, or 2.

Representative compounds of this formula include tetramethoxysilane, tetraethoxysilane, methyltriethoxysilane, dimethyldiethoxysilane, octadecyltriethoxysilane, methyltrichlorosilane, tetramethyl orthotitanate, tetraethyl orthotitanate, tetraisopropyl orthotitanate, tetraethylzirconate, tetraisopropylzirconate, and tetrapropylzirconate.

Preferably, the coating compositions of the invention are solvent-free. In some embodiments, however, the coating compositions comprise solvent such as, for example, ketones (for example, acetone or methyl isobutyl ketone (MIBK)), esters (for example, ethyl acetate), or ethers (for example, methyl tert-butyl ether (MTBE) or tetrahydrofuran (THF)), or combinations.

Method of Making Phototools

The hardcoat compositions described above are used to form a protective layer on phototools to provide scratch- and abrasion-resistance, as well as release properties. The hardcoat composition can be coated on the emulsion layer of the phototool by any useful coating technique known in the art. The hardcoat composition can then be cured on the phototool using UV light to form the protective layer. Typically, the protective layer comprising the cured hardcoat composition will be from about 0.5 microns to about 40 microns thick; preferably, from about 2 microns to about 15 microns thick; more preferably, from about 2 microns to about 10 microns thick.

The resulting protective layer has low surface energy with receding water contact angles greater than about 65° (preferably, greater than about 80°; more preferably, greater than about 90°) and receding hexadecane contact angles greater than about 50° (preferably, greater than about 55°; more preferably, greater than about 60°). The protective layer also exhibits good release properties/low peel force (for example, peel-off force of less than 600 g/in).

EXAMPLES

Objects and advantages of this invention are further illustrated by the following examples, but the particular materials and amounts thereof recited in these examples, as well as other conditions and details, should not be construed to unduly limit this invention.

Contact Angle Measurement

The coatings were rinsed for 1 minute by hand agitation in IPA before being subjected to measurement of water and hexadecane contact angles. Measurements were made using as-received reagent-grade hexadecane (Aldrich) and deionized water filtered through a filtration system obtained from Millipore Corporation (Billerica, Mass.), on a video contact angle analyzer available as product number VCA-2500XE from AST Products (Billerica, Mass.). Reported values are the averages of measurements on at least three drops measured on the right and the left sides of the drops. Drop volumes were 5 µL for static measurements and 1-3 µL for advancing and receding. For hexadecane, only advancing and receding contact angles are reported because static and advancing values were found to be nearly equal.

Marker Repellent Test

KING SIZE Permanent Marker, Sharpie Permanent Marker and Vis-à-vis Permanent Overhead Project Pen (all from SANFORD) were used for marker test and rated from 5 (completely bead-up) to 1 (no bead-up) in the order.

Solvent Resistant Test

On the coated and cured film, a big drop of MEK or other organic solvent was dropped in ~0.5 inch diameter. The appearance and change was visually rated and recorded after the solvent was allowed to evaporate at room temperature as, H for Hazy and C for Clear (no change of the coating). Then, a Sharpie permanent marker test was conducted over the dried MEK spot and rated as above (1 to 5). Reported values are the averages of three time ratings.

Steel Wool Durability Test

The abrasion resistance of the cured films was tested crossweb to the coating direction by use of a mechanical device capable of oscillating steel wool fastened to a stylus (by means of a rubber gasket) across the film's surface. The stylus oscillated over a 10 cm wide sweep width at a rate of 3.5 wipes/second wherein a "wipe" is defined as a single travel of 10 cm. The stylus had a flat, cylindrical geometry with a diameter of 3.8 mm having a 400 g load. The device was equipped with a platform on which weights were placed to increase the force exerted by the stylus normal to the film's surface. The steel wool was obtained from Rhodes-American a division of Homax Products, Bellingham, Wash. under the trade designation "#0000-Super-Fine" and was used as received. A single sample was tested for each sample, with the weight in grams applied to the stylus and the number of 50 wipes employed during testing reported in the tables. After scratch, Sharpie repellent was tested and contact angles were measured to determine the durability.

Cleaning Tissue Durability Test

Sight Savers pre-moisture lens cleaning tissue made from Bausch&Lomb was used for durability test, which contains IPA. After cleaning the surface of hardcoat for 20 times, Sharpie marker is re-tested and rated from 1 to 5 as before.

Examples with Perfluoropolyether-Urethane Silanes

Materials:

Unless otherwise noted, as used in the examples, "HFPO—" refers to the end group $F(CF(CF_3)CF_2O)_aCF(CF_3)$— of the methyl ester $F(CF(CF_3)CF_2O)_aCF(CF_3)C(O)OCH_3$, with an average molecular weight >1000 g/mol, can be prepared according to the method reported in U.S. Pat. No. 3,250,808 (Moore et al.).

$HFPO—C(O)N(H)CH_2CH_2OH$ (HFPO—OH or HFPO) was prepared by a procedure similar to that described in U.S. Publication No. 2004-0077775, entitled "Fluorochemical Composition Comprising a Fluorinated Polymer and Treatment of a Fibrous Substrate Therewith," filed on May 24, 2002, for Synthesis of HFPO-oligomer alcohols used.

Silquest A-186, Beta-(3,4-epoxycyclohexyl)ethyltrimethoxysilane), available from GE Advanced Materials;

Silquest A-187, Gamma-Glycidoxypropyltrimethoxysilane, available from GE Advanced Materials;

Polyisocyanate Desmodur™ (Des) N100 and N3300 were obtained from Bayer Polymers LLC, of Pittsburgh, Pa.

Isophonone diisocyanate (IPDI), 98% (MW=222.29), obtained from Aldrich.

Aminopropyltrimethoxy silane (APTMS) was obtained from Sigma-Aldrich of Milwaukee, Wis.

TDI, 2,4-Toluene diisocyanate (CAS No#: 26471-62-5), obtained from Sigma-Aldrich of Milwaukee, Wis.

HDI, 1,6-Hexamethylene diisocyanate (CAS NO#N 822-06-0), obtained from Sigma-Aldrich of Milwaukee, Wis.

MDI, 4,4'-Methylenediphenyl Diisocyanate (CAS No#101-68-8), obtained from Sigma-Aldrich of Milwaukee, Wis.

A-189, 3-Mercaptopropyltrimethoxysilane, available from GE Silicones—OSi Specialties.

A-1110, 3-Aminopropyltrimethoxysilane, available from GE Silicones—OSi Specialties.

Sn-catalyst, Di(n-butyl) dilaurate (DBTDL), 95%, obtained from Aldrich.

GPTE: Glycerol Propoxylate Triglycidyl Ether, obtained from Sigma-Aldrich of Milwaukee, Wis.

A-187 (Gamma-Glycidoxypropyltrimethoxysilane), available from Silquest;

A-186, Beta-(3,4-epoxycyclohexyl)ethyltrimethoxysilane, available from Silquest;

TEOS, Tetraethyl orthosilicate, $Si(OC_2H_5)_4$, available from Sigma-Aldrich.

Di-Epoxy, 1,4-Cyclohexanedimethanol diglycidyl ether (CAS#14228-73-0), Aldrich;

PI, photo-initiator, Cyracure UVI-6974, triarylsulphonium hexafluoroantimonate, 50% in propylene carbonate, available from Union Carbide Company.

ERL-4299, Bis-(3,4-epoxycyclohexylmethyl) adipate, available from Dow Chemical Company.

A-174, $CH_2=CMeC(O)O(CH_2)_3Si(OMe)_3$, available from Silquest.

Preparation of Additive, HFPO-Polyurethanes with Reactive Silane Group:

FA-1, HFPO/HDI/A-189 (3/10/7 by Equivalent Ratio):

A 100 ml round bottom flask equipped with magnetic stir bar was charged with 1.68 g (20 meq NCO, 10.00 mmole) HDI, 8.064 g HFPO—OH (EW=1344, 6 mmol), 2.744 g A-189 (MW=196, 14 mmol), 29.14 g Ethyl acetate (EtOAc), and 4 drops of DBTDL catalyst under nitrogen. The mixture was reacted at 70° C. for 4 hours to give a clear homogenous solution. From FTIR analysis, no isocyanate peak at ~2265 $cm^1$ was observed, indicating the completed reaction. The 30% solution is ready for evaluation.

FA-2, HFPO/TDI/A-189 (3/10/7 by Equivalent Ratio):

A 100 ml round bottom flask equipped with magnetic stir bar was charged with 1.74 g (20 meq NCO, 10.00 mmole) TDI, 8.064 g HFPO—OH (EW=1344, 6 mmol), 2.748 g A-189 (MW=196, 14 mmol), 29.28 g Ethyl acetate (EtOAc), and 4 drops of DBTDL catalyst under nitrogen. The mixture was reacted at 70° C. for 4 hours to give a clear homogenous solution. From FTIR analysis, no isocyanate peak at ~2265 $cm^{-1}$ was observed, indicating the completed reaction. The 30% solution is ready for evaluation.

FA-3, HFPO/MDI/A-189 (3/10/7 by Equivalent Ratio):

A 100 ml round bottom flask equipped with magnetic stir bar was charged with 2.50 g (20 meq NCO, 10.00 mmole) MDI, 8.064 g HFPO—OH (EW=1344, 6 mmol), 2.748 g A-189 (MW=196, 14 mmol), 31.05 Ethyl acetate (EtOAc), and 4 drops of BTDL catalyst under nitrogen. The mixture was reacted at 70° C. for 4 hours to give a clear homogenous solution. From FTIR analysis, no isocyanate peak at ~2265 $cm^{-1}$ was observed, indicating the completed reaction. The 30% solution is ready for evaluation.

FA-4, HFPO/N3300/A-189 (3/20/17 by Equivalent Ratio):

A 100 ml round bottom flask equipped with magnetic stir bar was charged with 3.82 g (20 meq NCO)N3300, 4.032 g HFPO—OH (EW=1344, 3 mmol), 3.332 g A-189 (MW=196, 17 mmol), 26.10 g Methyl Ethyl Ketone (MEK), and 4 drops of DBTDL catalyst under nitrogen. The cloudy mixture was reacted at 70° C. for 4 hours to give a clear homogenous solution. From FTIR analysis, no isocyanate peak at ~2265 $cm^{-1}$ was observed, indicating the completed reaction. The 30% solution is ready for evaluation.

FA-5, HFPO/N3600/A-189 (3/20/17 by Equivalent Ratio):

A 100 ml round bottom flask equipped with magnetic stir bar was charged with 3.66 g (20 meq NCO) N3600, 4.032 g HFPO—OH (EW=1344, 3 mmol), 1332 g A-189 (MW=196, 17 mmol), 25.72 g Methyl Ethyl Ketone (MEK), and 4 drops of DBTDL catalyst under nitrogen. The cloudy mixture was reacted at 70° C. for 4 hours to give a clear homogenous solution. From FTIR analysis, no isocyanate peak at ~2265 $cm^{-1}$ was observed, indicating the completed reaction. The 30% solution is ready for evaluation.

Preparation HFPO-Polyurethanes with Reactive Acrylate Silane Oligomer:

FA-6, HFPO/N100/HS-(A-174)$_3$/A-1110 (3/20/17 by Equivalent Ratio):

i) Preparation of HS-(A-174)$_3$ (Average Molecular Weight=822):

To a 4 Oz bottle were charged with 14.90 g A-174 (MW=248.4, 60 mmol), 1.56 g $HSCH_2CH_2OH$ (MW=78, 20 mmol), 38.41 g EtOAc and 0.3 g Vazo-67 under nitrogen. After bubbling the solution with nitrogen for 1 minute, the sealed bottle was polymerized in a 70° C. oil bath with a magnetic stirring for 24 hours, which gave a clear solution at 30% solid. From FTIR analysis, no $CH_2=CMeC(O)$— signal was observed, indicating the completed oligomerization.

ii) Preparation of FA-6, HFPO/N100/HS-(A-174)$_3$/A-1110 (3/20/17 by Equivalent Ratio):

In an 8 Oz bottle, charged with 5.73 g N100 (EW=190, 30 mmol), 13.14 g HFPO—OH (MW=1314, 10 mmol), 27.4 g 30% Si—OH-1 (8.22 g solid, 10 mmol), 49.5 g EtOAc solvent and 5 drops of DBTDL catalyst. The sealed bottle was reacted at 70° C. oil bath with a magnetic stirring for 4 hours. Then, 2.21 g APTMS (10 mmol) was added at room temperature, and the mixture was reacted at room temperature for 0.5 hour, followed by reaction at 70° C. for another 4 hours. A clear solution in 30% solid was obtained. From FTIR analysis, no unreacted —NCO signal was observed, indicating the completed reaction.

FA-7, HFPO/N3300/HS-(A-174)$_3$/A-1110 (3/20/17 by Equivalent Ratio):

FA-7 was prepared by similar procedure to FA-5, with 5.76 g N3300 in replacement of N100.

FA-8, HFPO—OH/N100/HS-(A-174)$_4$(ODA)$_{0.7}$ (in 1/3/2 Equivalent Ratio):

i) Preparation of HS-(A-174)$_4$(ODA)$_{0.7}$, (Average Molecular Weight=1294):

In an 8 Oz bottle, charged with 39.74 g A-174 (MW=248.4, 160 mmol), 8.70 g ODA (MW=324, 26.8 mmol), 3.12 g HSCH$_2$CH$_2$OH (MW=78, 40 mmol), 103.3 g EtOAc and 10. g Vazo-67. After bubbling with nitrogen for 1 minute, the sealed bottle was polymerized in a 70° C. oil bath with a magnetic stirring for 10 hours. Additional 0.70 g Vazo-67 was added and the oligomerization was continued for another 14 hours, which gave a clear solution in 33% solid. From FTIR analysis, no CH$_2$=CMeC(O)— signal was observed, indicating the completed oligomerization.

ii) Preparation of FA-8, HFPO—OH/N100/HS-(A-174)4(ODA)0.7:

In an 8 Oz bottle, charged with 2.93 g N100 (EW=190, 15.34 meq), 6.71 g HFPO—OH (MW=1314, 5.1 meq), 38.90 g 33% Si—OH-2 (12.99 g solid, 10 meq OH), 22.5 g EtOAc solvent and 4 drops of DBTDL catalyst. The sealed bottle was reacted at 70° C. oil bath with a magnetic stirring for 8 hours. From FTIR analysis, no unreacted —NCO signal was observed, indicating the completed reaction.

FA-9, HFPO—OH/N100/HS-(A-174)4(ODA)0.7 (in 0.70/3/2.25 Equivalent Ratio):

In an 8 Oz bottle, charged with 2.55 g N100 (EW=190, 13.35 meq NCO), 4.20 g HFPO—OH (MW=1344, 3.12 meq), 38.90 g 33% Si—OH-2 (12.99 g solid, 10 meq OH), 20 g EtOAc solvent and 4 drops of DBTDL catalyst. The sealed bottle was reacted at 70° C. oil bath with a magnetic stirring for 8 hours. From FTIR analysis, no unreacted —NCO signal was observed, indicating the completed reaction.

FA-10, HFPO—OH/IPDI/HS-(A-174)4(ODA)0.7 (in 1/2/1 Equivalent Ratio):

In an 8 Oz bottle, charged with 2.04 g IPDI (MW=222.29, 9.17 mmol), 12.05 g HFPO—OH (MW=1344, 9.17 mmol), 33 g MEK solvent and 4 drops of DBTDL catalyst. The sealed bottle was reacted at 70° C. oil bath with a magnetic stirring for 2 hours giving a clear solution. Then, 36.0 g 33% Si—OH-2 (11.88 g solid, 9.17 mmol) was added at room temperature, and the mixture was reacted at 70° C. for another 4 hours. From FTIR analysis, no unreacted —NCO signal was observed, indicating the completed reaction.

Preparation of Fluorinated Additive, Control-4 (C-4), HFPO—C(O)NHC$_2$H$_4$O—C(O)NH—C$_3$H$_6$Si(OEt)$_3$:

In a 4 Oz bottle, charged with 13.44 g HFPO—OH (MW=1344, 10 mmol), 2.473 g OCNCH$_2$CH$_2$CH$_2$Si(OEt)$_3$ (MW=247.3, 10 mmol; A-Ling™-25, available from Silquest), 47.74 g EtOAc and 4 drops of DBTDL catalyst. The sealed bottle was reacted at 70° C. oil bath with a magnetic stirring for 4 hours giving a clear solution. From FTIR analysis, no un-reacted —NCO signal was observed, indicating the completed reaction. The ~25% solution to be used as additive in epoxy-silane hardcoat formulation.

Epoxy-Silane Formulations:
ES-1, A-187/ERL-4299/IP at the ratio of 89/2/9 by weight;
ES-2, A-186/GPTE/PI at the ratio of 86/5/9 by weight;
ES-3, 3M Scotchgard Film Protector II, epoxy-silane based hardcoat, available from 3M.

Results and Discussion:

All formulations were coated on primed PET with No#6 wire rod, and cured with UV [two Sylvania Germicidal G15T8 (15 W) bulbs] in the air for 2 mins from the distance of 4 inches. Generally, all formulations were clear solution.

1. Epoxy-Silane Hardcoat with HFPO-Urethane-Silane Additive:

Table 1 summarizes the coating quality, marker repellent and contact angle data from examples of epoxy-silane hardcoat with HFPO-Urethane-Silane additive at different levels, with or without solvent (for coating thickness control).

TABLE 1

| Exp. No# | Formulation | Coating Quality | Marker Repellent* | H$_2$O Adv/Rec/Static | | | HD Adv/Rec/Static | | |
|---|---|---|---|---|---|---|---|---|---|
| C-1 | ES-1/F-additive 100/0 | Excellent | 1/1/1 | 87 | 38 | 85 | 21 | 12 | 19 |
| | | | | 85 | 38 | 83 | 21 | 11 | 19 |
| | | | | 85 | 38 | 82 | | | |
| Average | | | | 86 | 38 | 83 | 21 | 12 | 19 |
| C-2 | ES-2/F-additive 100/0 | Good | 01/1/1 | 77 | 44 | 68 | 12 | 4 | 10 |
| | | | | 78 | 45 | 67 | 12 | 5 | 11 |
| Average | | | | 78 | 45 | 68 | 12 | 5 | 11 |
| C-3 | ES-3/F-additive 100/0 | Good | 4/3/3 | 91 | 55 | 91 | 32 | 26 | 32 |
| | | | | 91 | 55 | 91 | 32 | 27 | 34 |
| Average | | | | 91 | 55 | 91 | 32 | 27 | 33 |
| 1 | ES-1/FA-1 99/1 | OK | 5/5/5 | 113 | 72 | 110 | 70 | 65 | 73 |
| | | | | 113 | 71 | 108 | 72 | 67 | 73 |
| Average | | | | 113 | 72 | 109 | 71 | 66 | 73 |
| 2 | ES-1/FA-1 98/2 | OK | 5/5/5 | 113 | 77 | 112 | 74 | 69 | 71 |
| | | | | 114 | 78 | 111 | 74 | 69 | 72 |

TABLE 1-continued

| Exp. No# | Formulation | Coating Quality | Marker Repellent* | H₂O Adv/Rec/Static | | | HD Adv/Rec/Static | | |
|---|---|---|---|---|---|---|---|---|---|
| | | | | 114 | 78 | 112 | 74 | 69 | 72 |
| 3 | ES-2/FA-1 98/2 | OK | 5/5/5 | 118 | 83 | 114 | 75 | 69 | 72 |
| | | | | 118 | 83 | 113 | 75 | 68 | 73 |
| Average | | | | 118 | 83 | 114 | 75 | 69 | 73 |
| 4 | ES-2/FA-1 98/2, in 50% MEK | OK | 4/5/5 | 120 | 84 | 115 | 75 | 69 | 72 |
| | | | | 121 | 84 | 115 | 76 | 70 | 73 |
| Average | | | | 121 | 84 | 115 | 76 | 70 | 73 |
| 5 | ES-1/FA-2 99/1 | Excellent | 2/5/5 | 113 | 73 | 107 | 69 | 65 | 70 |
| | | | | 114 | 71 | 107 | 69 | 66 | 71 |
| Average | | | | 114 | 72 | 107 | 69 | 66 | 71 |
| 6 | ES-1/FA-2 98/2 | Good | 3/5/5 | 116 | 74 | 112 | 72 | 68 | 71 |
| | | | | 117 | 76 | 110 | 73 | 69 | 71 |
| Average | | | | 117 | 75 | 111 | 73 | 69 | 71 |
| 7 | ES-1/FA-3 99/1 | Excellent | 2/5/5 | 114 | 73 | 109 | 73 | 63 | 70 |
| | | | | 113 | 74 | 109 | 74 | 67 | 72 |
| | | | | | | | 73 | 63 | 71 |
| Average | | | | 114 | 74 | 109 | 73 | 64 | 71 |
| 8 | ES-1/FA-3 98/2 | Excellent | 3/5/5 | 115 | 68 | 112 | 73 | 68 | 71 |
| | | | | 116 | 67 | 110 | 71 | 67 | 70 |
| Average | | | | 116 | 68 | 111 | 72 | 68 | 71 |
| 9 | ES-1/FA-3 98/2 | Good | 3/5/5 | 122 | 100 | 116 | 79 | 60 | 75 |
| | | | | 121 | 98 | 116 | 77 | 63 | 74 |
| | | | | 120 | 90 | 115 | | | |
| Average | | | | 121 | 96 | 116 | 78 | 62 | 75 |
| 10 | ES-1/FA-4 99/1 | Excellent | 5/5/5 | 116 | 75 | 112 | 69 | 64 | 70 |
| | | | | 117 | 74 | 111 | 70 | 63 | 72 |
| Average | | | | 117 | 75 | 112 | 70 | 64 | 71 |
| 11 | ES-1/FA-5 99/1 | Excellent | 5/5/5 | 110 | 63 | 109 | 69 | 58 | 71 |
| | | | | 110 | 62 | 110 | 71 | 57 | 71 |
| Average | | | | 110 | 63 | 110 | 70 | 58 | 71 |
| 12 | ES-2/FA-5 98/2 | Excellent | 5/5/5 | 114 | 70 | 110 | 72 | 61 | 70 |
| | | | | 113 | 70 | 109 | 73 | 60 | 70 |
| Average | | | | 114 | 70 | 110 | 73 | 61 | 70 |
| 13 | ES-2/FA-5 98/2, in 50% MEK | Excellent | 4/5/5 | 113 | 73 | 109 | 75 | 62 | 72 |
| | | | | 114 | 70 | 110 | 74 | 62 | 72 |
| Average | | | | 114 | 72 | 110 | 75 | 62 | 72 |
| C-4 | ES-1/C-4 98/2 | Dewet | Not Tested | Not Tested | | | Not Tested | | |
| C-5 | Release Liner** | N/A | 2/3/3 | 95 | 62 | 93 | 34 | 19 | 34 |
| | | | | 92 | 59 | 90 | 34 | 18 | 33 |
| Average | | | | 94 | 61 | 92 | 34 | 19 | 34 |

*The order of markers tested: King/Sharpie/Vis-à-vis;
**Used for laminating on ES-3 hardcoat for release performance made by Sekisui Chemical from Japan.

2. Epoxy-Silane Hardcoat with HFPO-Urethane-(Acrylate Silane Oligomer) Additive:

Table 2 summarizes the coating quality, marker repellent and contact angle data from examples of epoxy-silane hardcoat with HFPO-Urethane-Silane additive at different levels, with or without solvent.

TABLE 2

| Exp. No# | Formulation | Coating Quality | Marker Repellent* | H₂O Adv/Rec/Static | | | HD Adv/Rec/Static | | |
|---|---|---|---|---|---|---|---|---|---|
| 14 | ES-1/FA-6 99.5/0.5 | Good | 4/5/5 | 119 | 65 | 107 | 71 | 66 | 70 |
| | | | | 117 | 62 | 109 | 71 | 65 | 70 |
| Average | | | | 118 | 64 | 108 | 71 | 66 | 70 |
| 15 | ES-1/FA-6 99/1 | Good | 5/5/5 | 118 | 69 | 108 | 71 | 62 | 68 |
| | | | | 117 | 67 | 107 | 71 | 63 | 69 |
| Average | | | | 118 | 68 | 108 | 71 | 63 | 69 |
| 16 | ES-1/FA-6 98/2 | Good | 5/5/5 | 117 | 80 | 113 | 72 | 66 | 67 |
| | | | | 117 | 78 | 112 | 73 | 65 | 69 |
| Average | | | | 117 | 79 | 113 | 73 | 66 | 68 |
| 17 | ES-2/FA-6 98/2 | Good | 5/5/5 | 116 | 83 | 112 | 74 | 68 | 71 |
| | | | | 116 | 78 | 113 | 74 | 66 | 69 |
| | | | | 117 | 79 | 113 | | | |
| Average | | | | 116 | 80 | 113 | 74 | 67 | 70 |
| 18 | ES-2/FA-6 98/2, 50% in MEK | Excellent | 4/4/5 | 120 | 80 | 113 | 73 | 68 | 71 |
| | | | | 118 | 80 | 112 | 73 | 66 | 70 |

TABLE 2-continued

| Exp. No# | Formulation | Coating Quality | Marker Repellent* | H$_2$O Adv/Rec/Static | | | HD Adv/Rec/Static | | |
|---|---|---|---|---|---|---|---|---|---|
| | | | | 119 | 80 | 113 | 73 | 67 | 71 |
| 19 | ES-1/FA-6 95/5 | Good | 5/5/5 | 115 | 71 | 110 | 70 | 65 | 68 |
| | | | | 116 | 72 | 112 | 70 | 65 | 69 |
| Average | | | | 116 | 72 | 111 | 70 | 65 | 69 |
| 20 | ES-3/FA-6 98/2 | Good | 3/5/5 | 109 | 65 | 107 | 74 | 67 | 71 |
| | | | | 110 | 67 | 108 | 75 | 68 | 71 |
| Average 143466-88B | | | | 110 | 66 | 108 | 75 | 68 | 71 |
| 21 | ES-1/FA-7 99/1 | Excellent | 5/5/5 | 117 | 73 | 112 | 71 | 63 | 72 |
| | | | | 117 | 71 | 112 | 71 | 63 | 72 |
| Average | | | | 117 | 72 | 112 | 71 | 63 | 72 |
| 22 | ES-1/FA-7 98/2 | Excellent | 5/5/5 | 115 | 74 | 113 | 73 | 68 | 71 |
| | | | | 115 | 76 | 113 | 72 | 67 | 70 |
| Average | | | | 115 | 75 | 113 | 73 | 68 | 71 |
| 23 | ES-2/FA-7 98/2 | Excellent | 5/5/5 | 115 | 75 | 112 | 74 | 68 | 73 |
| | | | | 116 | 74 | 113 | 73 | 66 | 71 |
| Average | | | | 116 | 75 | 113 | 74 | 67 | 72 |
| 24 | ES-2/FA-7 98/2, in 50% MEK | Good | 5/5/4 | 118 | 78 | 112 | 77 | 69 | 71 |
| | | | | 118 | 79 | 112 | 73 | 66 | 70 |
| | | | | | | | 73 | 67 | 71 |
| Average | | | | 118 | 79 | 112 | 74 | 67 | 71 |
| 25 | ES-3/FA-7 98/2 143466-88C | Good | 3/5/5 | 108 | 72 | 109 | 72 | 65 | 71 |
| | | | | 111 | 72 | 110 | 72 | 65 | 70 |
| | | | | 107 | 71 | 109 | | | |
| 26 | ES-3/FA-8 98/2 | Good | 1/2/4 | 100 | 57 | 100 | 77 | 69 | 71 |
| | | | | 97 | 56 | 100 | 75 | 66 | 72 |
| | | | | 102 | 55 | 100 | 72 | 64 | 71 |
| Average | | | | 100 | 56 | 100 | 75 | 66 | 71 |
| 27 | ES-1/FA-9 99/1 | Excellent | 3/4/5 | 113 | 53 | 103 | 72 | 42 | 72 |
| | | | | 111 | 52 | 103 | 71 | 44 | 72 |
| Average | | | | 112 | 53 | 103 | 72 | 43 | 72 |
| 28 | ES-1/FA-10 99/1 | Excellent | 3/5/5 | 114 | 68 | 105 | 74 | 63 | 72 |
| | | | | 115 | 68 | 107 | 75 | 64 | 73 |
| Average | | | | 115 | 68 | 106 | 75 | 64 | 73 |

*King/Sharpie/Vis-a-vis.

3. HFPO-Urethane-Silane Containing Epoxy-Silane Hardcoat with Extra Crosslinkers:

Table 3 summarizes examples of HFPO-urethane-silane containing epoxy-silane hardcoat with extra crosslinkers.

TABLE 3

| Exp. No# | Formulation | Coating Quality | Marker Repellent* | H$_2$O Adv/Rec/Static | | | HD Adv/Rec/Static | | |
|---|---|---|---|---|---|---|---|---|---|
| 29 | ES-1/FA-6/Di-Epoxy 88/2/10 | Fair | 4/5/5 | 113 | 77 | 112 | 72 | 66 | 69 |
| | | | | 113 | 76 | 112 | 74 | 68 | 71 |
| Average | | | | 113 | 77 | 112 | 73 | 67 | 70 |
| 30 | ES-1/FA-6/TEOS 88/2/10 | Good | 3/5/5 | 113 | 72 | 111 | 70 | 66 | 68 |
| | | | | 114 | 74 | 111 | 72 | 67 | 70 |
| Average | | | | 114 | 73 | 111 | 71 | 67 | 69 |
| 31 | ES-1/FA-3/TEOS 88/2/10 | Fair | 2/5/4 | 113 | 73 | 111 | 72 | 67 | 70 |
| | | | | 113 | 75 | 111 | 72 | 68 | 70 |
| Average | | | | 113 | 74 | 111 | 72 | 68 | 70 |
| 32 | ES-1/FA-3/Di-Epoxy 88/2/10 | Good | 3/5/4 | 113 | 67 | 109 | 74 | 70 | 72 |
| | | | | 112 | 67 | 108 | 73 | 68 | 71 |
| Average | | | | 113 | 67 | 109 | 74 | 69 | 72 |

*King/Sharpie/Vis-a-vis.

4. Solvent Resistant Performance:

Solvent resistant test from selected coating films were studied and the results are summarized in Table 4.

TABLE 4*

| Exp. No# | Tissue Test (20 times Scratch) | Solvent | | | | | |
|---|---|---|---|---|---|---|---|
| | | EtOAc | IPA | Acetone | Toluene | MEK | DMF |
| 10 | C/5 | C/5 | C/5 | C/5 | C/5 | C/5 | C/5 |
| 16 | C/5 | C/5 | C/5 | C/5 | C/5 | C/5 | C/5 |
| 17 | C/5 | C/5 | C/5 | C/5 | C/5 | C/5 | C/5 |
| 22 | C/5 | C/5 | C/5 | C/5 | C/5 | C/5 | C/5 |
| 24 | C/5 | C/5 | C/5 | C/5 | C/5 | C/5 | C/5 |
| 29 | C/5 | C/5 | C/5 | C/5 | C/5 | C/5 | C/5 |
| 30 | C/5 | C/5 | C/5 | C/5 | C/5 | C/5 | C/5 |

TABLE 4*-continued

| Exp. No# | Tissue Test (20 times Scratch) | Solvent | | | | | |
|---|---|---|---|---|---|---|---|
| | | EtOAc | IPA | Acetone | Toluene | MEK | DMF |
| 31 | C/5 | C/5 | C/5 | C/5 | C/5 | C/5 | C/5 |
| 32 | C/5 | C/5 | C/5 | C/5 | C/5 | C/5 | C/5 |

*C, clear coating after solvent test (no coating appearance change); 5, excellent repellent to Sharpie marker.

5. Steel Wood Durability Test Results (50 Time Rubs at 400 g Weight):

Steel wood durability test from coated films were studied and the results are summarized in Table 5.

TABLE 5

| Exp. No# | Coating Appearance | Marker Repellent* | $H_2O$ Adv/Rec/Static | | | HD Adv/Rec/Static | | |
|---|---|---|---|---|---|---|---|---|
| 1 | No scratch | 5/5/5 | 111 | 76 | 108 | 73 | 66 | 71 |
| | | | 111 | 76 | 108 | 72 | 64 | 70 |
| Average | | | 111 | 76 | 108 | 73 | 65 | 71 |
| 2 | No scratch | 5/5/5 | 111 | 80 | 107 | 72 | 61 | 68 |
| | | | 112 | 80 | 109 | 73 | 64 | 71 |
| | | | | | | 75 | 66 | 71 |
| Average | | | 112 | 80 | 108 | 73 | 64 | 70 |
| 5 | No scratch | 2/5/5 | 109 | 65 | 109 | 64 | 54 | 63 |
| | | | 107 | 63 | 104 | 65 | 53 | 65 |
| Average | | | 108 | 64 | 107 | 65 | 54 | 64 |
| 6 | No scratch | 3/5/4 | 113 | 78 | 110 | 71 | 62 | 68 |
| | | | 114 | 76 | 109 | 72 | 60 | 68 |
| Average | | | 114 | 77 | 110 | 72 | 61 | 68 |
| 7 | No scratch | 2/5/4 | 109 | 65 | 107 | 67 | 55 | 66 |
| | | | 111 | 65 | 105 | 67 | 54 | 66 |
| Average | | | 110 | 65 | 106 | 67 | 55 | 66 |
| 10 | No scratch | 5/5/5 | 115 | 73 | 111 | 70 | 62 | 68 |
| | | | 113 | 75 | 110 | 71 | 62 | 68 |
| Average | | | 114 | 74 | 111 | 71 | 62 | 68 |
| 22 | No scratch | 4/5/5 | 111 | 71 | 108 | 71 | 60 | 68 |
| | | | 109 | 71 | 108 | 69 | 59 | 68 |
| Average | | | 110 | 71 | 108 | 70 | 60 | 68 |
| 29 | No scratch | 3/5/5 | 109 | 77 | 107 | 71 | 64 | 69 |
| | | | 109 | 76 | 108 | 71 | 63 | 68 |
| Average | | | 109 | 77 | 108 | 71 | 64 | 69 |
| 30 | No scratch | 3/5/5 | 113 | 69 | 108 | 68 | 57 | 67 |
| | | | 113 | 72 | 108 | 69 | 59 | 66 |
| Average | | | 113 | 71 | 108 | 69 | 58 | 67 |
| 31 | No scratch | 2/5/4 | 114 | 75 | 109 | 68 | 60 | 67 |
| | | | 113 | 68 | 108 | 70 | 61 | 68 |
| | | | 115 | 74 | 110 | | | |
| Average | | | 114 | 72 | 109 | 69 | 61 | 68 |
| C-5** | Scratched | Not Tested | Not measured | | | Not measured | | |

*King/Sharpie/Vis-à-vis;
**Release Liner for laminating on ES-3 hardcoat; Tested only 4 time rubs at 200 g weight.

6. Peel Release Testing and Ink Release Testing:

Unless otherwise noted, all parts, percentages, ratios, etc. in the examples and the rest of the specification are by weight, and all reagents used in the examples were obtained, or are available, from general chemical suppliers such as, for example, Sigma-Aldrich Company, Saint Louis, Mo., or may be synthesized by conventional methods.

Samples were prepared for release testing by attaching 3-layer laminates of backing/releasable hardcoat/tape to a 17.8 centimeter by 33 centimeter steel panel using double-coated adhesive tape (commercially available from 3M Company under the trade designation "410B") via the backing side of the construction using a 2.3 kg rubber roller. The tape was then peeled from the RHC at 180° at a rate of 2.3 meters/minute (90 inches/minute). All tests were done in a facility at constant temperature (70° C.) and constant humidity (50% RH). The peel tester used for all examples was an IMass model SP2000 peel tester obtained from IMASS, Inc., Accord, Mass. Measurements were obtained in grams/inch.

A release film was prepared by coating a solution of CP-1 (0.2% solids by weight diluted with MEK) on PET film-1 using a No. 6 Mayer rod, and then drying the coated film for 2 minutes at 150° C. Adhesive 1 was wet cast onto this release film by spreading the adhesive onto the release film using a notch bar coater 15 centimeters wide (6 inches) with a 356 micrometer (14 mil) wet gap. This adhesive coated release film was attached to a fiberboard frame and dried for 10 minutes at 70° C. The adhesive/release film system was then laminated to PET film-3. The laminate was then subjected to the Release Test. Table 6 summarizes peel release results with FA-4 as additive in ES-1 at different level.

TABLE 6

| Exp. No# | Formulation ES-1/FA-4 | Tested Tape Type | Average Peel Force (g/in) |
|---|---|---|---|
| C-1 | 100/0 | 845 | 2340 |
| C-1 | 100/0 | 610 | 1460 |
| 33 | 99.5/0.5 | 845 | 580 |
| 34 | 98/2 | 845 | 570 |
| 35 | 95/5 | 845 | 550 |
| 36 | 99.5/0.5 | 610 | 485 |
| 37 | 98/2 | 610 | 430 |
| 38 | 95/5 | 610 | 400 |

Release Test from Ink:

Below are the results of a single ink transfer test. Scale went from 0 to 5 where 0 is no ink transfer, 5 is 100% ink transfer to the hardcoat and 2.5 would be approximately a 50% transfer. Representative examples are summarized in Table 7.

TABLE 7

| Exp. No# | ES-1/FA-4 | Ink Transfer Before UV Curing | Ink Transfer After UV Curing |
|---|---|---|---|
| C-1 | 100/0 | 5 | 5 |
| C-1 | 100/0 | 5 | 5 |
| 39 | 99.5/0.5 | 0 | 0 |
| 40 | 98/2 | 0 | 0 |
| 41 | 95/5 | 0 | 0 |

Ink release durability was tested by multiple release of Exp. No#36 from ink. Each time a fresh piece of ink was added to the hardcoat and removed. After 5 separate and new laminations, there was still no transfer of the ink to the hardcoat (Table 8).

TABLE 8

| Exp. No# | ES-1/FA-4 | Ink Transfer Application No# | Ink Transfer After UV Curing |
|---|---|---|---|
| 39 | 99.5/0.5 | 1 | 0 |
| 42 | 99.5/0.5 | 2 | 0 |
| 43 | 99.5/0.5 | 3 | 0 |
| 44 | 99.5/0.5 | 4 | 0 |
| 45 | 99.5/0.5 | 5 | 0 |

Examples with Silane-Functionalized Perfluoropolyether Acrylate Oligomers

Materials:

HFPO—C(O)N(H)CH$_2$CH$_2$OC(O)CMe=CH$_2$ (HFPO-MAr, average molecular weight 1344) was prepared by a procedure similar to that described in U.S. Publication No. 2004-0077775, entitled "Fluorochemical Composition Comprising a Fluorinated Polymer and Treatment of a Fibrous Substrate Therewith," filed on May 24, 2002, for Synthesis of (HFPO)$_x$-methacrylate.

A-174, $CH_2$=CMeC(O)O(CH$_2$)$_3$Si(OMe)$_3$, available from Silquest.

A-160, HS(CH$_2$)$_3$Si(OMe)$_3$, available from Silquest.

A-187 (Gamma-Glycidoxypropyltrimethoxysilane), available from Silquest;

A-186, Beta-(3,4-Epoxycyclohexyl)ethyltrimethoxysilane, available from Silquest;

PI, photo-initiator, Cyracure UVI-6974, triarylsulphonium hexafluoroantimonate, 50% in propylene carbonate, available from Union Carbide Company.

GPTE, Glycerol Propoxylate Triglycidyl Ether, obtained from Sigma-Aldrich of Milwaukee, Wis.

TEOS, Tetraethyl orthosilicate, Si(OC$_2$H$_5$)$_4$, available from Sigma-Aldrich.

Di-Epoxy, 1,4-Cyclohexanedimethanol diglycidyl ether (CAS#14228-73-0), Aldrich;

ERL-4299, Bis-(3,4-epoxycyclohexylmethyl) adipate, available from Dow Chemical Company.

Preparation of Reactive Silane Functionalized Perfluoropolyether Acrylate Oligomers:

FA-11, HFPO-MAr/A-174/A-160 (in 10/90/2 Ratio by Weight):

To a 4 Oz bottle with a magnetic stir bar, 1.0 g of HFPO-MAr (MW~1344, 0.744 mmol), 9.0 g A-174 (MW=248, 36.3 mmol), 0.2 g A-160 (MW=198, 1.02 mmol), 30 g MEK and 0.258 g Vazo-67 were charged. The solution was oligomerized at 70° C. for 24 hours after nitrogen bubbling for 1 minute. A clear homogeneous solution was obtained. From FTIR analysis, no $CH_2$=CMe- signal was observed.

FA-12, HFPO-MAr/A-174/A-160 (in 20/80/2 Ratio by Weight):

To a 4 Oz bottle with a magnetic stir bar, 2.0 g of HFPO-MAr (MW~1344, 1.48 mmol), 8.0 g A-174 (MW=248, 32.2 mmol), 0.2 g A-160 (MW=198, 1.02 mmol), 30 g MEK and ~0.221 g Vazo-67 were charged. The solution was oligomerized at 70° C. for 24 hours after nitrogen bubbling. A clear homogeneous solution was obtained. From FTIR analysis, no $CH_2$=CMe- signal was observed.

FA-13, HFPO-MAr/A-174/A-160 (in 30/70/2 Ratio by Weight):

To a 4 Oz bottle with a magnetic stir bar, 3.0 g of HFPO-MAr (MW~1344, 2.23 mmol), 7.0 g A-174 (MW=248, 28.22 mmol), 0.20 g A-160 (MW=198, 1.02 mmol), 30 g MEK and 0.254 g Vazo-67 were charged. The solution was oligomerized at 70° C. for 24 hours after nitrogen bubbling. A clear homogeneous solution was obtained. From FTIR analysis, almost no $CH_2$=CMe- signal was observed.

FA-14, HFPO-MAr/A-174/A-160 (in 40/60/2 Ratio by Weight) in MEK:

To a 4 Oz bottle with a magnetic stir bar, 4.0 g of HFPO-MAr (MW~1344, 2.976 mmol), 6.0 g A-174 (MW=248, 24.19 mmol), 0.20 g A-160 (MW=198, 1.02 mmol), 30 g MEK and 0.195 g Vazo-67 were charged. The solution was oligomerized at 70° C. for 24 hours after nitrogen bubbling. A clear homogeneous solution was obtained. From FTIR analysis, almost no $CH_2$=CMe- signal was observed.

FA-15, HFPO-MAr/A-174/A-160 in EtOAc (at 40/60/2 Ratio by Weight) in EtOAc:

To a 4 Oz bottle with a magnetic stir bar, 4.0 g of HFPO-MAr (MW~1344, 2.976 mmol), 6.0 g A-174 (MW=248, 24.19 mmol), 0.20 g A-160 (MW=198, 1.02 mmol), 30 g ethyl acetate and 0.238 g Vazo-67 were charged. The solution was oligomerized at 70° C. for 24 hours after nitrogen bubbling. A clear homogeneous solution was obtained. From FTIR analysis, almost no $CH_2$=CMe- signal was observed.

FA-16, HFPO-MAr/A-174/A-160 (in 50/50/2 Ratio by Weight):

To a 4 Oz bottle with a magnetic stir bar, 5.0 g of HFPO-MAr (MW~1344, 3.72 mmol), 5.0 g A-174 (MW=248, 20.16 mmol), 0.20 g A-160 (MW=198, 1.02 mmol), 30 g MEK and 0.303 g Vazo-67 were charged. The solution was oligomerized at 70° C. for 24 hours after nitrogen bubbling. A slightly cloudy solution was obtained. From FTIR analysis, almost no $CH_2$=CMe- signal was observed.

FA-17, HFPO-MAr/A-174/A-160 (in 60/40/2 Ratio by Weight):

With the procedure as described in ROI N#7515 or OMTC-27, 6.0 g HFPO-MAr (MW~1344, 4.46 mmol) was oligomerized with 4.0 g A-174 (MW=248, 16.1 mmol), 0.2 g A-160 (MW=198, 1.02 mmol), 30 g MEK and 0.2 g Vazo-67 in a 4 Oz bottle at 70° C. for 24 hours after nitrogen bubbling. A clear solution was obtained after reaction at 70° C., however, cloudy at room temperature. Small phase separation was found after standing at room temperature for 24 hours. 15 g HFE-401 was added for making clear and homogeneous solution at 18.2% solution for formulation.

Epoxy-Silane Formulations:

ES-1, A-187/ER-4299/PI at the ratio of 89/2/9 by weight;
ES-2, A-186/GPTE/PI at the ratio of 86/5/9 by weight;
ES-3, 3M Scotchgard Film Protector II Results and Discussion:

All formulations were coated on primed PET with No#6 wire rod, and cured with different UV sources as identified below for 2 minutes. Generally, all formulations were clear solution (unless noted).

UV-1: H-Bulb under N$_2$, two pass at 25 feet per minute;
UV-2: Two Sylvania Germicidal G15T8 (15 W) bulbs in the air;
UV-3: Two Black Light Blue UV (F15T8BLB15W) bulbs in the air.

1. Epoxy-Silane Hardcoat with Reactive Silane Functionalized Perfluoropolyether Acrylate Oligomers (RSFPAO) Additives:

A series of reactive silane functionalized perfluoropolyether acrylate oligomers (RSFPAO) were blended into epoxy-silane formulations at different levels (1~5% by weight), and cured with different UV sources. The examples of coating quality, marker repellent and contact angle have been summarized in Table 1.

TABLE 1

| Exp. No# | Formulation (ratio by weight) | Coating Quality | Marker Repellent* | H$_2$O Adv/Rec/Static | | | HD Adv/Rec/Static | | |
|---|---|---|---|---|---|---|---|---|---|
| 1 | ES-1/FA-11 | Good | 5/5/5 | 110 | 84 | 108 | 69 | 59 | 68 |
|   | 98/2 |   |   | 113 | 81 | 107 | 71 | 61 | 68 |
|   | UV-2 |   |   | 111 | 85 | 109 |   |   |   |
| Average |   |   |   | 111 | 83 | 108 | 70 | 60 | 68 |
| 2 | ES-1/FA-11 | Good | 5/5/5 | 108 | 85 | 103 | 70 | 59 | 69 |
|   | 98/2 |   |   | 109 | 85 | 105 | 70 | 59 | 69 |

TABLE 1-continued

| Exp. No# | Formulation (ratio by weight) | Coating Quality | Marker Repellent* | H₂O Adv | H₂O Rec | H₂O Static | HD Adv | HD Rec | HD Static |
|---|---|---|---|---|---|---|---|---|---|
| 3 | UV-3 ES-1/FA-12 98/2 | Good | 5/5/5 | 109 113 115 | 85 77 77 | 104 102 103 | 70 71 70 | 59 62 55 | 69 70 75 |
| Average | | | | 114 | 77 | 103 | 71 | 57 | 73 |
| 4 | UV-1 ES-1/FA-12 98/2 | Good | 5/5/5 | 110 110 112 | 83 87 83 | 106 108 106 | 71 70 71 | 55 61 62 | 74 68 68 |
| Average | | | | 111 | 84 | 107 | 71 | 62 | 68 |
| 5 | UV-2 ES-1/FA-12 95/5 | Good | 5/5/5 | 115 113 114 | 74 75 75 | 106 105 106 | 71 70 71 | 56 55 56 | 76 76 76 |
| Average | | | | 114 | 75 | 106 | 71 | 56 | 76 |
| 6 | UV-1 ES-1/FA-12 95/5 | Good | 5/5/5 | 113 113 113 | 84 85 85 | 107 108 108 | 70 70 70 | 61 62 62 | 68 68 68 |
| Average | | | | 113 | 85 | 108 | 70 | 62 | 68 |
| 7 | UV-2 ES-1/FA-13 98/2 | Excellent | 5/5/5 | 118 116 117 | 87 90 89 | 112 111 112 | 70 72 71 | 62 64 63 | 68 68 68 |
| Average | | | | 118 | 97 | 112 | 72 | 64 | 69 |
| 8 | UV-2 ES-2/FA-14 99/1 | Good | 5/5/5 | 118 118 118 | 96 97 97 | 113 111 112 | 73 71 72 | 64 63 64 | 69 69 69 |
| Average | | | | 118 | 99 | 111 | 72 | 65 | 71 |
| 9 | UV-2 ES-2/FA-14 98/2 | Excellent | 5/5/5 | 118 119 119 | 99 99 99 | 111 112 112 | 73 71 72 | 66 64 65 | 71 70 71 |
| Average | | | | 120 | 99 | 114 | 74 | 66 | 72 |
| 10 | UV-3 ES-2/FA-14 95/5 | Excellent | 5/5/5 | 120 121 121 | 99 99 99 | 114 113 114 | 74 74 74 | 66 66 66 | 72 73 73 |
| Average | | | | 117 | 99 | 111 | 70 | 63 | 69 |
| 11 | UV-3 ES-1/FA-14 98/2 | Good | 5/5/5 | 117 117 117 | 99 92 96 | 111 112 112 | 70 69 70 | 63 61 62 | 69 70 70 |
| Average | | | | 118 | 104 | 112 | 74 | 69 | 72 |
| 12 | UV-2 ES-1/FA-14 98/2 | Excellent | 5/5/5 | 118 119 119 | 104 105 105 | 112 113 113 | 74 73 74 | 69 69 69 | 72 72 72 |
| Average | | | | 115 | 100 | 109 | 71 | 62 | 73 |
| 13 | UV-1 ES-1/FA-14 98/2 | Good | 5/5/5 | 115 115 115 | 100 99 100 | 109 110 110 | 71 72 72 | 62 61 62 | 73 70 72 |
| Average | | | | 119 | 96 | 110 | 73 | 68 | 70 |
| 14 | UV-3 ES-3/FA-14 98/2 | Excellent | 5/5/5 | 119 119 119 | 96 98 97 | 110 111 111 | 73 74 74 | 68 69 69 | 70 71 71 |
| Average | | | | 117 | 100 | 113 | 71 | 62 | 69 |
| 15 | UV-2 ES-1/FA-14 95/5 | Good | 5/5/5 | 117 117 117 | 100 99 100 | 113 113 113 | 71 71 71 | 62 64 63 | 69 71 70 |
| Average | | | | 117 | 102 | 113 | 74 | 62 | 74 |
| 16 | UV-2 ES-1/FA-14 95/5 | Good | 5/5/5 | 117 116 117 | 102 102 102 | 113 112 113 | 74 72 73 | 62 62 62 | 74 72 73 |
| Average | | | | 115 | 98 | 113 | 74 | 68 | 73 |
| 17 | UV-3 ES-1/FA-15 98/2 | Excellent | 5/5/5 | 115 116 116 | 98 100 99 | 113 113 113 | 74 73 74 | 68 68 68 | 73 72 73 |
| Average | | | | 119 | 106 | 113 | 74 | 69 | 71 |
| 18 | UV-2 ES-1/FA-16 98/2 | Excellent | 5/5/5 | 119 119 119 | 106 106 106 | 113 114 114 | 74 72 73 | 69 68 69 | 71 72 72 |
| Average | | | | 118 | 96 | 110 | 72 | 65 | 72 |
| 19 | UV-2 ES-1/FA-17 98/2 | Fair | 5/5/5 | 118 118 118 | 96 99 98 | 110 111 111 | 72 71 72 | 65 65 65 | 72 72 72 |
| Average | | | | 116 | 96 | 110 | 70 | 63 | 68 |
| 20 | UV-3 ES-1/FA-17 99/1 | Fair | 5/5/5 | 116 117 117 | 96 95 96 | 110 109 110 | 70 70 70 | 63 64 64 | 68 68 68 |
| Average | | | | 87 | 38 | 85 | 21 | 12 | 19 |
| C-1 | UV-3 ES-1 0% F-additive | Excellent | 1/1/1 | 87 85 85 | 38 38 38 | 85 83 82 | 21 21 | 12 11 | 19 19 |
| Average | | | | 86 | 38 | 83 | 21 | 12 | 19 |
| C-2 | UV-2 ES-2 0% F-additive | Fair | 1/1/1 | 77 78 78 | 44 45 45 | 68 67 68 | 12 12 12 | 4 5 5 | 10 11 11 |
| Average | | | | 91 | 55 | 91 | 32 | 26 | 32 |
| C-3 | ES-3/F-additive 100/0 | Good | 4/3/3 | 91 91 91 | 55 55 55 | 91 91 91 | 32 32 32 | 26 27 27 | 32 34 33 |
| Average | | | | 95 | 62 | 93 | 34 | 19 | 34 |
| C-4 | Release Liner** | N/A | 2/3/3 | 95 92 94 | 62 59 61 | 93 90 92 | 34 34 34 | 19 18 19 | 34 33 34 |

*The order of markers tested: King/Sharpie/Vis-à-vis;
**Used for laminating on ES-3 hardcoat for release performance made by Sekisui Chemical from Japan.

2. Reactive Silane Functionalized Perfluoropolyether Acrylate Oligomers Containing Epoxy-Silane Hardcoat with Extra Crosslinkers:

Table 2 summarizes examples of epoxy-silane hardcoat with extra crosslinkers.

TABLE 2

| Exp. No# | Formulation (ratio by weight) | Coating Quality | Marker Repellent* | $H_2O$ Adv/Rec/Static | | | HD Adv/Rec/Static | | |
|---|---|---|---|---|---|---|---|---|---|
| 21 | ES-1/FA-14/TEOS 90/5/5 | Good | 5/5/5 | 119 | 101 | 110 | 72 | 67 | 70 |
|  |  |  |  | 120 | 99 | 111 | 71 | 67 | 70 |
| Average | UV-2 |  |  | 120 | 100 | 111 | 72 | 67 | 70 |
| 22 | ES-1/FA-14/TEOS 85/5/10 | Good | 5/5/5 | 117 | 103 | 112 | 75 | 66 | 71 |
|  |  |  |  | 115 | 102 | 111 | 73 | 66 | 72 |
| Average | UV-3 |  |  | 116 | 103 | 112 | 74 | 66 | 72 |
| 23 | ES-1/FA-14/Di-Epoxy 93/2/5 | Fair | 5/5/5 | 117 | 94 | 111 | 71 | 68 | 70 |
|  |  |  |  | 119 | 95 | 112 | 73 | 69 | 72 |
| Average | UV-2 |  |  | 118 | 95 | 112 | 72 | 69 | 71 |
| 24 | ES-1/FA-14/Di-Epoxy 88/2/10 | Fair | 5/5/5 | 115 | 92 | 108 | 75 | 70 | 74 |
|  |  |  |  | 115 | 92 | 110 | 73 | 69 | 72 |
| Average | UV-2 |  |  | 115 | 92 | 109 | 74 | 70 | 73 |
| 25 | ES-1/FA-14/Di-Epoxy 83/2/15 | Fair | 5/5/5 | 114 | 92 | 107 | 72 | 67 | 70 |
|  |  |  |  | 115 | 92 | 108 | 72 | 68 | 71 |
| Average | UV-2 |  |  | 115 | 92 | 108 | 72 | 68 | 71 |
| 26 | ES-1/FA-14/Di-Epoxy 78/2/20 | Poor | 4/5/5 | 114 | 85 | 108 | 72 | 63 | 71 |
|  |  |  |  | 112 | 86 | 108 | 72 | 63 | 69 |
| Average | UV-2 |  |  | 113 | 86 | 108 | 72 | 63 | 70 |
| 27 | ES-1/FA-14/Di-Epoxy 80/5/15 | Good | 4/5/5 | 115 | 92 | 110 | 73 | 68 | 71 |
|  |  |  |  | 115 | 92 | 111 | 74 | 69 | 72 |
| Average | UV-2 |  |  | 115 | 92 | 111 | 74 | 69 | 72 |
| 28 | ES-1/FA-13/Di-Epoxy 83/2/15 | Excellent | 4/5/5 | 111 | 83 | 109 | 70 | 59 | 68 |
|  |  |  |  | 111 | 85 | 107 | 70 | 61 | 68 |
| Average | UV-2 |  |  | 111 | 84 | 108 | 70 | 60 | 68 |
| 29 | ES-2/FA-13/Di-Epoxy 88/2/10 | Excellent | 5/5/5 | 114 | 86 | 109 | 73 | 61 | 70 |
|  |  |  |  | 112 | 86 | 110 | 72 | 60 | 69 |
| Average | UV-2 |  |  | 113 | 86 | 110 | 73 | 61 | 70 |
| 30 | ES-1/FA-41/GPTE 90/5/5 | Good | 5/5/5 | 117 | 100 | 110 | 72 | 65 | 69 |
|  |  |  |  | 117 | 98 | 110 | 72 | 66 | 70 |
| Average | UV-3 |  |  | 117 | 99 | 110 | 72 | 66 | 70 |

*The order of Markers: King/Sharpie/Vis-à-vis.

3. Solvent Based Epoxy-Silane Hardcoat with Reactive Silane Functionalized Perfluoropolyether Acrylate Oligomers Additive:

The effect of solvent to epoxy-silane based hardcoat with silane-perfluoropolyether acrylate oligomers was studied. The examples are summarized in Table 3.

TABLE 3

| Exp. No# | Formulation* (ratio by weight) | Coating Quality | Marker Repellent** | $H_2O$ Adv/Rec/Static | | | HD Adv/Rec/Static | | |
|---|---|---|---|---|---|---|---|---|---|
| 31 | ES-2/FA-14 95/5 | Excellent | 5/5/5 | 118 | 102 | 113 | 69 | 62 | 67 |
|  |  |  |  | 119 | 102 | 113 | 71 | 64 | 69 |
| Average | 30% in MEK |  |  | 119 | 102 | 113 | 70 | 63 | 68 |
| 32 | ES-1/FA-14/TEOS 90/5/5 | Excellent | 5/5/5 | 119 | 106 | 114 | 71 | 64 | 69 |
|  |  |  |  | 119 | 103 | 115 | 71 | 65 | 70 |
|  | 50% in MEK |  |  | 120 | 102 | 113 |  |  |  |
| Average |  |  |  | 119 | 104 | 114 | 71 | 65 | 70 |
| 33 | ES-1/FA-14/TEOS 85/5/10 | Excellent | 5/5/5 | 119 | 104 | 114 | 73 | 66 | 70 |
|  |  |  |  | 118 | 105 | 113 | 71 | 66 | 69 |
| Average | 30% in MEK |  |  | 118 | 105 | 114 |  |  |  |
|  |  |  |  | 118 | 105 | 114 | 72 | 66 | 70 |
| 34 | ES-1/FA-14/Di-Epoxy 93/2/5 | Excellent | 5/5/5 | 114 | 87 | 107 | 72 | 67 | 70 |
|  |  |  |  | 115 | 88 | 107 | 74 | 69 | 72 |
| Average | 50% in MEK |  |  | 115 | 88 | 107 | 73 | 68 | 71 |
| 35 | A-187/FA-14/Di-Epoxy 88/2/10 | Excellent | 5/5/5 | 116 | 88 | 108 | 72 | 66 | 70 |
|  |  |  |  | 117 | 89 | 108 | 73 | 67 | 71 |
| Average | 50% in MEK |  |  | 117 | 89 | 108 | 73 | 67 | 71 |
| 36 | ES-1/FA-14/Di-Epoxy 83/2/15 | Excellent | 4/5/5 | 115 | 90 | 112 | 72 | 64 | 71 |
|  |  |  |  | 118 | 89 | 109 | 72 | 64 | 71 |
|  | 50% in MEK |  |  | 117 | 88 | 112 |  |  |  |
| Average |  |  |  | 117 | 89 | 111 | 72 | 64 | 71 |
| 37 | ES-1/FA-14/Di-Epoxy 78/2/20 | Good | 3/5/5 | 118 | 90 | 113 | 70 | 64 | 71 |
|  |  |  |  | 118 | 90 | 112 | 70 | 65 | 72 |

TABLE 3-continued

| Exp. No# | Formulation* (ratio by weight) | Coating Quality | Marker Repellent** | $H_2O$ Adv/Rec/Static | | | HD Adv/Rec/Static | | |
|---|---|---|---|---|---|---|---|---|---|
| Average | 50% in MEK | | | 118 | 90 | 113 | 70 | 65 | 72 |
| 38 | ES-1/FA-14/Di-Epoxy 80/5/15 | Excellent | 4/5/5 | 119 | 94 | 113 | 69 | 64 | 70 |
| | | | | 118 | 94 | 113 | 70 | 65 | 70 |
| Average | 50% in MEK | | | 119 | 94 | 113 | 70 | 65 | 70 |
| 39 | ES-1/FA-13/Di-Epoxy 83/2/15 | Good | 5/5/5 | 114 | 85 | 109 | 68 | 60 | 69 |
| | | | | 115 | 87 | 110 | 67 | 61 | 69 |
| Average | 50% in MEK | | | 115 | 86 | 110 | 68 | 61 | 69 |
| 40 | ES-2/FA-13/Di-Epoxy 88/2/10 | Excellent | 5/5/5 | 116 | 93 | 113 | 69 | 56 | 70 |
| | | | | 118 | 92 | 113 | 69 | 58 | 70 |
| Average | 50% in MEK | | | 117 | 93 | 113 | 69 | 57 | 70 |
| 41 | ES-1/FA-14/GPTE 90/5/5 | Excellent | 5/5/5 | 117 | 98 | 112 | 71 | 65 | 69 |
| | | | | 115 | 99 | 111 | 71 | 64 | 70 |
| Average | 50% in MEK | | | 116 | 99 | 112 | 71 | 65 | 70 |

*All cured with UV-2;
**The order of Markers: King/Sharpie/Vis-à-vis.

From Table 3, the solvent had very limited effect on marker repellent and water/oil contact angles.

4. Formulation Stability Study Over Time

The time effect on performance was studied. Table 4 summarizes results, which indicate no performance change over the time up to 34 days.

TABLE 4

| Exp. No# | Formulation (ratio by weight) | Coating Quality | Marker Repellent* | $H_2O$ Adv/Rec/Static | | | HD Adv/Rec/Static | | |
|---|---|---|---|---|---|---|---|---|---|
| 15 | ES-1/FA-14 (95/5) UV-2 | Good | 5/5/5 | 117 | 100 | 113 | 71 | 62 | 69 |
| | | | | 117 | 99 | 113 | 71 | 64 | 71 |
| Average | Day-1 | | | 117 | 100 | 113 | 71 | 63 | 70 |
| 42 | ES-1/FA-14 (95/5) UV-2 | Good | 5/5/5 | 118 | 96 | 115 | 69 | 61 | 70 |
| | | | | 117 | 95 | 114 | 70 | 61 | 69 |
| Average | Day-9 | | | 118 | 96 | 115 | 70 | 61 | 70 |
| 43 | ES-1/FA-14 (95/5) UV-2 | Good | 5/5/5 | 118 | 95 | 113 | 73 | 69 | 71 |
| | | | | 116 | 96 | 112 | 73 | 68 | 71 |
| Average | Day-19 | | | 117 | 96 | 113 | 73 | 69 | 71 |
| 44 | ES-1/FA-14 (95/5) UV-2 | Excellent | 4/5/5 | 116 | 94 | 109 | 72 | 68 | 70 |
| | | | | 116 | 95 | 111 | 73 | 68 | 70 |
| Average | Day-28 | | | 116 | 95 | 110 | 73 | 68 | 70 |
| 45 | ES-1/FA-14 (95/5) UV-2 | Good | 5/5/5 | 117 | 94 | 110 | 74 | 68 | 71 |
| | | | | 117 | 95 | 112 | 74 | 68 | 71 |
| Average | Day-34 | | | 117 | 95 | 111 | 74 | 68 | 71 |

*The order of Markers: King/Sharpie/Vis-à-vis.

5. Solvent Resistant Performance:

Solvent resistant test from coating films were studied, and the results are summarized in Table 5.

TABLE 5*

| Exp. No# | Tissue Test (20 times Scratch) | Solvent | | | | | |
|---|---|---|---|---|---|---|---|
| | | EtOAc | IPA | Acetone | Toluene | MEK | DMF |
| 1 | C/5 | C/5 | C/5 | C/5 | C/5 | C/5 | C/5 |
| 4 | C/5 | C/5 | C/5 | C/5 | C/5 | C/5 | C/5 |
| 7 | C/5 | C/5 | C/5 | C/5 | C/5 | C/5 | C/5 |
| 9 | C/5 | C/5 | C/5 | C/5 | C/5 | C/5 | C/5 |
| 11 | C/5 | C/5 | C/5 | C/5 | C/5 | C/5 | C/5 |
| 17 | C/5 | C/5 | C/5 | C/5 | C/5 | C/5 | C/5 |
| 18 | C/5 | C/5 | C/5 | C/5 | C/5 | C/5 | C/5 |
| 19 | C/5 | C/5 | C/5 | C/5 | C/5 | C/5 | C/5 |
| 21 | C/5 | C/5 | C/5 | C/5 | C/5 | C/5 | C/5 |
| 23 | C/5 | C/5 | C/5 | C/5 | C/5 | C/5 | C/5 |
| 30 | C/5 | C/5 | C/5 | C/5 | C/5 | C/5 | C/5 |
| 31 | C/5 | C/5 | C/5 | C/5 | C/5 | C/5 | C/5 |
| 33 | C/5 | C/5 | C/5 | C/5 | C/5 | C/5 | C/5 |
| 39 | C/5 | C/5 | C/5 | C/5 | C/5 | C/5 | C/5 |
| 41 | C/5 | C/5 | C/5 | C/5 | C/5 | C/5 | C/5 |

*C, clear coating after solvent test (no coating appearance change); Rate 5, excellent repellent to Sharpie marker.

The results from Table 5 indicate that the well crosslinked epoxy-silane hardcoat has excellent solvent resistance.

6. Steel Wood Durability Test Results (50 Times Rub at 400 g Weight):

Steel wood durability test on coated films was studied and the results after 50 time rubs with 400 g weight are summarized in Table 6.

TABLE 6

Results after Steel Wood Durability Test

| Exp. No# | Coating Appearance | Marker Repellent* | H₂O Adv/Rec/Static | | | HD Adv/Rec/Static | | |
|---|---|---|---|---|---|---|---|---|
| C-1 | No scratch | 1/1/1 | 72 | 34 | 62 | 15 | 6 | 13 |
|  |  |  | 65 | 33 | 61 | 17 | 7 | 13 |
|  |  |  | 72 | 40 | 63 |  |  |  |
| Average |  |  | 70 | 36 | 62 | 16 | 7 | 13 |
| 10 | No scratch | 5/5/5 | 117 | 74 | 105 | 67 | 53 | 63 |
|  |  |  | 116 | 85 | 107 | 67 | 51 | 64 |
|  |  |  | 114 | 86 | 109 |  |  |  |
| Average |  |  | 116 | 82 | 107 | 67 | 52 | 64 |
| 21 | No scratch | 5/5/5 | 117 | 95 | 110 | 70 | 62 | 69 |
|  |  |  | 117 | 94 | 110 | 70 | 64 | 68 |
| Average |  |  | 117 | 95 | 110 | 70 | 63 | 69 |
| 22 | No scratch | 5/5/5 | 120 | 97 | 111 | 73 | 66 | 71 |
|  |  |  | 119 | 98 | 112 | 73 | 66 | 71 |
| Average |  |  | 120 | 98 | 112 | 73 | 66 | 71 |
| 31 | No scratch | 5/5/5 | 117 | 93 | 110 | 69 | 56 | 67 |
|  |  |  | 117 | 94 | 111 | 70 | 56 | 68 |
| Average |  |  | 117 | 94 | 111 | 70 | 56 | 68 |
| 32 | No scratch | 5/5/5 | 118 | 100 | 111 | 73 | 65 | 71 |
|  |  |  | 117 | 99 | 110 | 71 | 66 | 70 |
| Average |  |  | 118 | 100 | 111 | 72 | 66 | 71 |
| 33 | No scratch | 5/5/5 | 118 | 89 | 112 | 73 | 67 | 70 |
|  |  |  | 119 | 93 | 113 | 72 | 66 | 71 |
| Average |  |  | 119 | 91 | 113 | 73 | 67 | 71 |
| 41 | No scratch | 5/5/5 | 110 | 90 | 107 | 70 | 63 | 69 |
|  |  |  | 113 | 95 | 107 | 69 | 63 | 67 |
|  |  |  | 110 | 95 | 107 |  |  |  |
| Average |  |  | 111 | 93 | 107 | 70 | 63 | 68 |
| C-4** | Scratched | Not Tested | Not measured | | | Not measured | | |

*King/Sharpie/Vis-à-vis;
**Release Liner for laminating on ES-3 hardcoat; Tested only 4 time rubs at 200 g weight.

7. Peel Release Testing and Ink Release Testing:

Unless otherwise noted, all parts, percentages, ratios, etc. in the examples and the rest of the specification are by weight, and all reagents used in the examples were obtained, or are available, from general chemical suppliers such as, for example, Sigma-Aldrich Company, Saint Louis, Mo., or may be synthesized by conventional methods.

Samples were prepared for release testing by attaching 3-layer laminates of backing/releasable hardcoat/tape to a 17.8 centimeter by 33 centimeter steel panel using double-coated adhesive tape (commercially available from 3M Company under the trade designation "410B") via the backing side of the construction using a 2.3 kg rubber roller.

The tape was then peeled from the RHC at 180° at a rate of 2.3 meters/minute (90 inches/minute). All tests were done in a facility at constant temperature (70° C.) and constant humidity (50% RH). The peel tester used for all examples was an IMass model SP2000 peel tester obtained from IMASS, Inc., Accord, Mass. Measurements were obtained in grams/inch.

A release film was prepared by coating a solution of CP-1 (0.2% solids by weight diluted with MEK) on PET film-1 using a No. 6 Mayer rod, and then drying the coated film for 2 minutes at 150° C. Adhesive 1 was wet cast onto this release film by spreading the adhesive onto the release film using a notch bar coater 15 centimeters wide (6 inches) with a 356 micrometer (14 mil) wet gap. This adhesive coated release film was attached to a fiberboard frame and dried for 10 minutes at 70° C. The adhesive/release film system was then laminated to PET film-3. The laminate was then subjected to the Release Test. Table 7 summarized representative peel release results with FA-4 as additive in ES-1 at different level.

TABLE 7

| Exp. No# | Formulation ES-1/FA-14 | Tested Tape Type | Average Peel Force (g/in) |
|---|---|---|---|
| C-1 | 100/0 | 845 | 2340 |
| C-1 | 100/0 | 610 | 1460 |
| 46 | 99.5/0.5 | 845 | 450 |
| 47 | 98/2 | 845 | 405 |
| 48 | 95/5 | 845 | 360 |
| 49 | 99.5/0.5 | 610 | 590 |
| 50 | 98/2 | 610 | 540 |
| 51 | 95/5 | 610 | 520 |

Release Test From Ink:

Below are the results of a single ink transfer test. Scale went from 0 to 5 where 0 is no ink transfer, 5 is 100% ink transfer to the hardcoat and 2.5 would be approximately a 50% transfer. Examples are summarized in Table 8.

TABLE 8

| Exp. No# | ES-1/FA-14 | Ink Transfer Before UV Curing | Ink Transfer After UV Curing |
|---|---|---|---|
| C-1 | 100/0 | 5 | 5 |
| C-1 | 100/0 | 5 | 5 |
| 52 | 99.5/0.5 | 2 | 0 |
| 53 | 98/2 | 0 | 0 |
| 54 | 95/5 | 2 | 0 |

Additional Examples on Different Substrates
1. Additional Examples on Different Substrates Measured Using Goniometer

| Example | Formulation* | H₂O Adv/Rec/Static | | | HD Adv/Rec/Static | | | Marker Repellent** | Coating Quality | Substrate |
|---|---|---|---|---|---|---|---|---|---|---|
| A | ES-3/FA-15 | 116 | 90 | 109 | 74 | 69 | 71 | 5/5/5 | Excellent | PET |
|  | 98/2 | 116 | 92 | 110 | 74 | 67 | 71 |  |  |  |
| Average | UV-2 | 116 | 91 | 110 | 74 | 68 | 71 |  |  |  |
| B | ES-3/FA-15 | 115 | 97 | 108 | 72 | 66 | 69 | 3/5/5 | Excellent | Ag-Window Film |
|  | 98/2 | 118 | 94 | 108 | 72 | 66 | 69 |  |  |  |
|  | UV-2 | 116 | 96 | 108 |  |  |  |  |  |  |
| Average |  | 116 | 96 | 108 | 72 | 66 | 69 |  |  |  |
| C | ES-3/FA-15 | 117 | 99 | 110 | 71 | 67 | 70 | 5/5/5 | Good | PC |
|  | 98/2 | 116 | 100 | 111 | 72 | 68 | 70 |  |  |  |
| Average | UV-2 | 117 | 100 | 111 | 72 | 68 | 70 |  |  |  |
| D | ES-3/FA-15 | 115 | 97 | 108 | 72 | 66 | 69 | 3/5/5 | Excellent | PMMA |
|  | 98/2 | 116 | 97 | 109 | 72 | 66 | 69 |  |  |  |

| Example. | Formulation* | H₂O Adv/Rec/Static | | | HD Adv/Rec/Static | | | Marker Repellent** | Coating Quality | Substrate |
|---|---|---|---|---|---|---|---|---|---|---|
| | UV-2 | 116 | 97 | 109 | 72 | 66 | 69 | | | |
| E | ES-3/FA-15 | 114 | 93 | 109 | 72 | 66 | 69 | 4/5/5 | Excellent | Ceramic |
| | 98/2 | 115 | 94 | 110 | 73 | 67 | 69 | | | |
| Average | UV-2 | 115 | 94 | 110 | 73 | 67 | 69 | | | |

*ES-3, Scotchgard FX1000, available from 3M; FA, HFPO-MAr/A174/A189 (40/60/2)
**Marker order: King/Sharpie/VisaVis 2. On Glass—Hardness & Contact Angle Results:

| Example | Formulation* | H₂O Adv/Rec/Static | | | HD Adv/Rec/Static | | | Hardness** | Coating Quality |
|---|---|---|---|---|---|---|---|---|---|
| Comparative | GCP-100 | 99 | 52 | 89 | 30 | 25 | 30 | 4H | Good |
| | Control (No F-additive) | 97 | 54 | 90 | 32 | 26 | 30 | | |
| Average | UV-2 | 98 | 53 | 90 | 31 | 26 | 30 | | |
| F | GCP-100/FA-15 | 118 | 100 | 112 | 69 | 65 | 70 | 5H | Good |
| | 98/2 | 118 | 99 | 112 | 72 | 66 | 70 | | |
| | UV-2 | | | | 70 | 66 | 70 | | |
| Average | | 118 | 100 | 112 | 70 | 66 | 70 | | |
| G | GCP-100/FA-15/EP3 | 116 | 98 | 111 | 72 | 66 | 69 | 6H | Good |
| | 93/2/5 | 118 | 98 | 112 | 71 | 66 | 70 | | |
| Average | UV-2 | 117 | 98 | 112 | 72 | 66 | 70 | | |
| H | FA-15/Epoxide 3 | 118 | 101 | 112 | 71 | 66 | 69 | 6H | Good |
| | 88/2/10 | 118 | 99 | 112 | 72 | 66 | 69 | | |
| Average | UV-2 | 118 | 100 | 112 | 72 | 66 | 69 | | |
| I | FA-15/Epoxide 3 | 117 | 98 | 109 | 72 | 66 | 72 | 7H- | Good |
| | 83/2/15 | 118 | 98 | 111 | 71 | 64 | 70 | | |
| Average | UV-2 | 118 | 97 | 110 | 72 | 65 | 71 | | |

*: GPC-100: Hardcoat for glass, available from 3M
FA: HFPO-MAr/A174/A189 (40/60/2)- (25%, L-20282)
Ep-3:

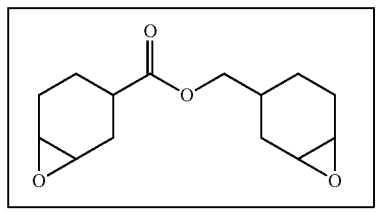 [SMILES: O=C(OCC1CCC2OC2C1)C1CCC2OC2C1]

**: Hardness tested using a Gardco-pencil scratch hardness tester. Samples were tested until a clear scratch appears across coated slide/film. The hardness recorded is the hardest pencil that did not scratch the surface. Scale- soft to hard, (6B-7H);
UV-1: H-Bulb under N₂, two pass at 25 feet per minute;
UV-2: Two Sylvania Germicidal G15T8 (15 W) bulbs in air.

3. On Polyester Slides with H-Bulb Curing at Different Speed, Measured Using Goniometer

| Example | Formulation* | H₂O Adv/Rec/Static | | | HD Adv/Rec/Static | | | Marker Repellent** | Coating Quality |
|---|---|---|---|---|---|---|---|---|---|
| J | A187/FA-15 | 117 | 98 | 111 | 72 | 67 | 70 | 5/5/5 | Excellent |
| | 98/2 | 118 | 99 | 112 | 73 | 68 | 71 | | |
| | UV-1 | | | | | | | | |
| Average | 25 ft/min | 118 | 99 | 112 | 73 | 68 | 71 | | |
| K | A187/FA-15 | 118 | 98 | 112 | 72 | 67 | 71 | 5/5/5 | Excellent |
| | 98/2 | 117 | 97 | 112 | 72 | 67 | 71 | | |
| | UV-1 | | | | | | | | |

-continued

| Example | Formulation* | H₂O Adv/Rec/Static | | | HD Adv/Rec/Static | | | Marker Repellent** | Coating Quality |
|---|---|---|---|---|---|---|---|---|---|
| Average | 20 ft/min | 118 | 98 | 112 | 72 | 67 | 71 | | |
| L | A187/FA-15 98/2 UV-1 | 114 116 | 87 89 | 112 111 | 71 71 | 56 55 | 71 70 | 5/5/5 | Excellent |
| Average | 10 ft/min | 115 | 88 | 112 | 71 | 56 | 71 | | |

**Marker order: King/Sharpie/Visa Vis
*A187,

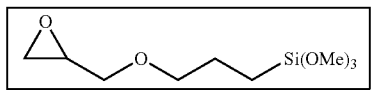

/UVI-6976 (45/4.5)
146377-53A HFPO-MAr/A174/A189 (40/60/2)

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

We claim:
1. A phototool comprising:
   (a) an optically transparent substrate having a designed pattern; and
   (b) a protective layer on the substrate, the protective layer comprising a cured hardcoat composition; wherein the hardcoat composition comprises:
      (i) one or more epoxy silane compounds;
      (ii) one or more fluorochemical additives selected from the group consisting of perfluoropolyether-urethane silanes and silane-functionalized perfluoropolyether acrylate oligomers; and
      (iii) photo-acid generator.
2. The phototool of claim 1 wherein the substrate comprises a photosensitive emulsion layer.
3. The phototool of claim 2 wherein the emulsion layer comprises a silver halide emulsion or a diazo emulsion.
4. The phototool of claim 1 wherein the substrate is polyethylene terephthalate film, polycarbonate film, poly(methyl) methacrylate film, or glass.
5. The phototool of claim 1 wherein the epoxy silane compound is an epoxy-terminated silane compound.
6. The phototool of claim 5 wherein the epoxy silane compound is selected from the group consisting of γ-glycidoxypropyl trimethoxy silane, γ-glycidoxypropylmethyldiethoxysilane, and beta-(3,4-epoxycyclohexyl)ethyltrimethoxysilane.
7. The phototool of claim 1 wherein the fluorochemical additive is a perfluoropolyether-urethane silane.
8. The phototool of claim 7 wherein the fluorochemical additive is represented by the following formula:

$$(R_fQXC(O)NH)_m—R^3—(NHC(O)XQ(Si(Y)_p)(R_2)_{3-p})_q)_n$$

wherein
  $R_f$ is a monovalent perfluoropolyether moiety;
  Q is independently a connecting group of valence at least 2, which may contain heteroatoms;
  X is O, S, or NR, wherein R is H or a lower alkyl of 1 to 4 carbon atoms;
  $R^3$ is a residue of a multi-isocyanate;
  Y is a hydrolysable group selected from —OR₂ and —OC(O)R₂;
  R₂ is a lower alkyl of 1 to 4 carbon atoms;
  m is at least 1; n is at least 1; p is 1, 2 or 3; q is from 1 to 6; and
  m+n is from 2 to 10.
9. The phototool of claim 7 wherein the fluorochemical additive is represented by the following formula:

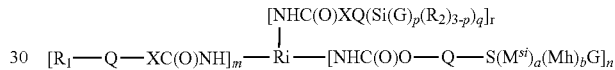

wherein:
  $R_f$ is a monovalent perfluoropolyether moiety;
  Q is independently a connecting group of valence at least 2, which may contain heteroatoms;
  X is O, S, or NR, wherein R is H or a lower alkyl of 1 to 4 carbon atoms;
  G is the residue of a free radical initiator or hydrogen;
  Ri is a residue of a multi-isocyanate;
  $M^{si}$ is the radical from acrylate monomer with a curable silane group, —SiY¹Y²Y³, wherein Y¹, Y² and Y³ are independently a halogen or a hydrolysable alkoxy group with no more than two alkyl group(s);
  $M^h$ is the radical from one or more hydrocarbon acrylate monomer;
  a is at least 1; b is zero to 20; q is 1 to 4; m is at least 1; n is at least 1; p is 1, 2 or 3; q is from 1 to 6; r is from 0 to 6.
10. The phototool of claim 1 wherein the fluorochemical additive is a silane-functionalized perfluoropolyether acrylate oligomer.
11. The phototool of claim 10 wherein the fluorochemical additive has the following general structure:

$$(M^{si})_a(M^h)_b(M^{HFPO})_cG$$

wherein:
  $M^{si}$ is a radical from acrylate or methacrylate monomer with a curable silane group, —SiY¹Y²Y³, where in Y¹, Y², and Y³ are independently hydrolysable halogen or alkoxy groups with no more than two alkyl groups;
  $M^{HFPO}$ is a radical from perfluoropolyether-containing acrylate or methacrylate monomer;
  $M^h$ is a radical from one or more hydrocarbon acrylate monomers;
  G is a radical from chain transfer agent with or without functional groups; and
  a is at least two; b is 0 to 50; and c is at least 1.

12. The phototool of claim 11 wherein $M^{HFPO}$ is a radical from perfluoropolyether made from the oligomerization of hexafluoropropylene oxide.

13. The phototool of claim 10 wherein the fluorochemical additive has the following general structure:

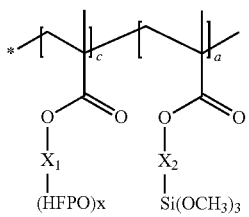

wherein:
HFPO is $C_3F_7O(CF(CF_3)CF_2O)_nCF(CF_3)$— wherein n averages from 1 to 50;
$X_1$ is a divalent linkage;
$X_2$ is a divalent linkage;
x is at least 3;
c is at least 1; and
a is at least 1.

14. The phototool of claim 1 wherein the fluorochemical additive comprises from about 0.1% by weight to about 10% by weight of the hardcoat composition.

15. The phototool of claim 14 wherein the fluorochemical additive comprises from about 0.5% by weight to about 5% by weight of the hardcoat composition.

16. The phototool of claim 1 wherein the hardcoat composition further comprises one or more multi-epoxide compounds.

17. The phototool of claim 16 wherein the hardcoat composition further comprises one or more cycloaliphatic diepoxide compounds.

18. The phototool of claim 1 wherein the hardcoat composition further comprises one or more curable silane compounds.

19. The phototool of claim 1 wherein the hardcoat composition further comprises a compound having the following general structure:

$(R)_qM(R^1)_{p-q}$ wherein
R is selected from the group consisting of alkyl, aryl, arylalkylenyl, and alkylarylenyl;
M is selected from the group consisting of Si, Ti, Zr and Al;
$R^1$ is selected from the group consisting of halide, hydroxyl, alkoxy, aryloxy, acyloxy, and polyalkyleneoxy;
p is 3 or 4; and
q is 0, 1, or 2.

20. The phototool of claim 19 wherein M is Si.

21. The phototool of claim 1 wherein the protective layer is from about 0.5 microns to about 40 microns thick.

22. The phototool of claim 1 wherein the protective layer has a receding water contact angle no less than about 65° and a receding hexadecane contact angle no less than about 50°.

23. The phototool of claim 1 wherein the protective layer has a peel-off force of less than about 600 g/in.

24. A method of making a printed circuit comprising placing the phototool of claim 1 on a photoresist layer, exposing the photoresist layer and phototool to high intensity light, and removing the phototool from the photoresist layer.

25. The method of claim 24 wherein the photoresist layer further comprises solder mask ink.

26. The method of claim 24 wherein the method is repeated 5 times or more.

27. A hardcoat composition comprising
one or more epoxy silane compounds;
one or more fluorochemical additives selected from the group consisting of perfluoropolyether-urethane silanes and silane-functionalized perfluoropolyether acrylate oligomers;
one or more curable silane compounds; and
photo-acid generator.

* * * * *

UNITED STATES PATENT AND TRADEMARK OFFICE
CERTIFICATE OF CORRECTION

PATENT NO. : 8,563,221 B2
APPLICATION NO. : 12/922129
DATED : October 22, 2013
INVENTOR(S) : Zai-Ming Qiu et al.

It is certified that error appears in the above-identified patent and that said Letters Patent is hereby corrected as shown below:

Title Page 2, Column 2 (Other Publications)
Line 1, Delete "Choognam," and insert -- Chungnam, --, therefor.

In the Specification

Column 7
Line 30, Delete "heteroacyloxxy," and insert -- heteroacyloxy, --, therefor.

Column 10
Line 51, Delete "$R^3$" and insert -- $R^5$ --, therefor.

Column 10
Line 55, Delete "Formula" and insert -- Formula (1B-1): --, therefor.

Colum 10
Line 59, Delete "(IB-1)" and insert -- (1B-1) --, therefor.

Column 12
Lines 51-52, Delete "$R_fZR^2-X'-(CONH-Q(A)_m-NHCOX'R^3 \quad X'-)_nCONH-Q(A)-NHCO \quad X'R^1Si(Y)_3$" and insert -- $R_fZR^2-X'-(CONH-Q(A)_m-NHCO-X'R^3 X'-)_nCONH-Q(A)-NHCO-X'R^1Si(Y)_3$ --, therefor.

Column 17
Line 38, Delete "(HFPO)x" and insert -- $(HFPO)_x$ --, therefor.

Column 17
Line 52, Delete "weight" and insert -- weight. --, therefor.

Signed and Sealed this
Twenty-second Day of April, 2014

Michelle K. Lee
*Deputy Director of the United States Patent and Trademark Office*

CERTIFICATE OF CORRECTION (continued)
U.S. Pat. No. 8,563,221 B2

Column 19

Lines 45-55, Delete " 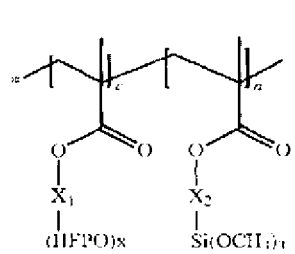 " and insert -- 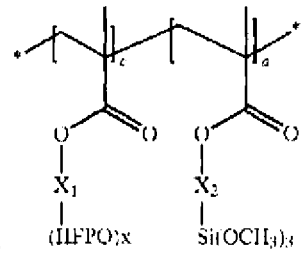 --, therefor.

In the Claims

Column 46

Lines 29-30, In Claim 9, Delete " 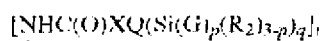 "

and insert -- 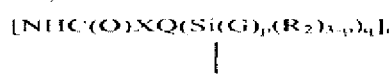 --, therefor.

Column 46
Line 58, In Claim 11, Delete "where in" and insert -- wherein --, therefor.

Column 47

Lines 6-15, In Claim 13, Delete " 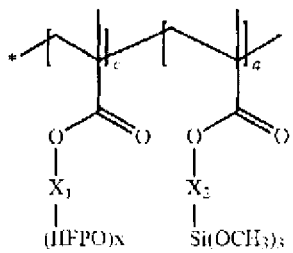 " and insert -- 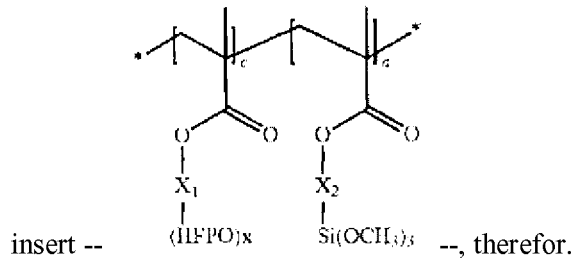 --, therefor.

Column 48
Line 32 (Approx.), In Claim 27, Delete "one" and insert -- (a) one --, therefor.

Column 48
Line 33 (Approx.), In Claim 27, Delete "one" and insert -- (b) one --, therefor.

Column 48

Line 37 (Approx.), In Claim 27, Delete "one" and insert -- (c) one --, therefor.

Column 48

Line 38 (Approx.), In Claim 27, Delete "photo-acid" and insert -- (d) photo-acid --, therefor.